United States Patent
Kim et al.

(10) Patent No.: US 10,698,761 B2
(45) Date of Patent: Jun. 30, 2020

(54) MEMORY SYSTEM AND METHOD FOR OPERATING SEMICONDUCTOR MEMORY DEVICE

(71) Applicant: SK hynix Inc., Icheon-si Gyeonggi-do (KR)

(72) Inventors: Nam Hoon Kim, Seoul (KR); Min Kyu Lee, Cheongju-si (KR)

(73) Assignee: SK hynix Inc., Icheon-si, Gyeonggi-do (KR)

(*) Notice: Subject to any disclaimer, the term of this patent is extended or adjusted under 35 U.S.C. 154(b) by 151 days.

(21) Appl. No.: 15/874,261

(22) Filed: Jan. 18, 2018

(65) Prior Publication Data

US 2019/0012227 A1   Jan. 10, 2019

(30) Foreign Application Priority Data

Jul. 6, 2017   (KR) .................. 10-2017-0086102

(51) Int. Cl.
| | |
|---|---|
| G06F 11/10 | (2006.01) |
| G11C 16/10 | (2006.01) |
| H03M 13/15 | (2006.01) |
| G11C 29/52 | (2006.01) |
| H03M 13/19 | (2006.01) |

(Continued)

(52) U.S. Cl.
CPC ........ *G06F 11/1044* (2013.01); *G06F 11/102* (2013.01); *G06F 11/1048* (2013.01); *G06F 11/1056* (2013.01); *G06F 11/1072* (2013.01); *G11C 16/10* (2013.01); *G11C 16/102* (2013.01); *H03M 13/1585* (2013.01); *G11C 16/0483* (2013.01); *G11C 29/52* (2013.01); *G11C 2029/0411* (2013.01); *H03M 13/1102* (2013.01); *H03M 13/152* (2013.01); *H03M 13/1515* (2013.01); *H03M 13/19* (2013.01)

(58) Field of Classification Search
CPC ............ G06F 11/1044; G06F 11/1048; G06F 11/1056; G06F 11/102; G06F 11/1072; G11C 16/10; G11C 16/102; G11C 16/0483; G11C 2029/0411; G11C 29/52; H03M 13/1585; H03M 13/19; H03M 13/152; H03M 13/1102; H03M 13/1515
See application file for complete search history.

(56) References Cited

U.S. PATENT DOCUMENTS

| | | | | |
|---|---|---|---|---|
| 2010/0232226 A1* | 9/2010 | Kim | ..................... | G11C 16/349 365/185.19 |
| 2013/0024605 A1* | 1/2013 | Sharon | ................ | G06F 11/1072 711/103 |

(Continued)

FOREIGN PATENT DOCUMENTS

| | | |
|---|---|---|
| KR | 1020120098079 A | 9/2012 |
| KR | 101662309 B1 | 10/2016 |

*Primary Examiner* — Cynthia Britt
(74) *Attorney, Agent, or Firm* — William Park & Associates Ltd.

(57) ABSTRACT

A method for operating a semiconductor memory device may include applying a program pulse for programming data of a first page included in the semiconductor memory device. The method may include determining whether the number of times of applying the program pulse has exceeded a first critical value. The method may include performing an error bit check on a second page coupled to the same word line as the first page, based on the determined result of whether the first critical value has been exceeded.

20 Claims, 15 Drawing Sheets

(51) Int. Cl.
*G11C 16/04* (2006.01)
*H03M 13/11* (2006.01)
*G11C 29/04* (2006.01)

(56) References Cited

U.S. PATENT DOCUMENTS

| | | | |
|---|---|---|---|
| 2013/0188431 A1* | 7/2013 | Scheuerlein | G11C 7/04 365/189.09 |
| 2014/0281814 A1* | 9/2014 | Vogan | G06F 11/1008 714/766 |
| 2015/0364213 A1* | 12/2015 | Kessenich | G11C 29/04 365/185.19 |
| 2016/0253112 A1* | 9/2016 | Chen | G06F 3/0647 714/6.21 |

* cited by examiner

MEMORY SYSTEM AND METHOD FOR OPERATING SEMICONDUCTOR MEMORY DEVICE

CROSS-REFERENCE TO RELATED APPLICATION

The present application claims priority under 35 U.S.C. § 119(a) to Korean patent application number 10-2017-0086102 filed on Jul. 6, 2017 in the Korean Intellectual Property Office, the entire disclosure of which is incorporated herein by reference.

BACKGROUND

1. Technical Field

An aspect of the present disclosure generally relates to an electronic device, and more particularly, to a memory system and a method for operating a semiconductor memory device.

2. Related Art

Memory devices may be formed in a two-dimensional structure in which strings are arranged horizontally to a semiconductor substrate, or be formed in a three-dimensional structure in which strings are arranged vertically to a semiconductor substrate. A three-dimensional semiconductor device is a memory device devised in order to overcome the limits of degrees of integration in two-dimensional semiconductor devices, and may include a plurality of memory cells vertically stacked on a semiconductor substrate.

SUMMARY

According to an aspect of the present disclosure, there may be provided a method for operating a semiconductor memory device. The method may include applying a program pulse for programming data of a first page included in the semiconductor memory device. The method may include determining whether the number of times of applying the program pulse has exceeded a first critical value. The method may include performing an error bit check on a second page coupled to the same word line as the first page, based on the determined result of whether the first critical value has been exceeded.

According to an aspect of the present disclosure, there may be provided a memory system. The memory system may include a semiconductor memory device including a first page coupled to a first word line and a second page coupled to the first word line. The memory system may include a controller configured to control an operation of the semiconductor memory device. The controller may control the semiconductor memory device to perform an error bit check on the second page based on the number of times a program pulse is applied to the first word line.

According to an aspect of the present disclosure, there may be provided a memory system. The memory system may include a semiconductor memory device including a first page coupled to a first word line and a second page coupled to the first word line. The memory system may include a controller configured to control an operation of the semiconductor memory device. The controller may control the semiconductor memory device to perform an error bit check on the second page based on a threshold voltage of a memory cell included in the second page changing as a result of a program pulse, for programming the first page, being applied to the first word line.

According to an aspect of the present disclosure, there may be provided a method for operating a semiconductor memory device. The method may include applying a program pulse to a first word line coupled to a first page and a second page, the program pulse being applied to the first word line to program data into the first page included in the semiconductor memory device. The method may include determining whether a threshold value of a memory cell included in the second page has changed from a first value to a second value, and whether the second value is greater than a value of a read voltage used to verify a state of the memory cell. The method may include performing an error bit check on the second page based on the determined result of whether the threshold value has changed and whether the second value is greater than the value of the read voltage used to verify the state of the memory cell.

DETAILED DESCRIPTION

Figure 1:
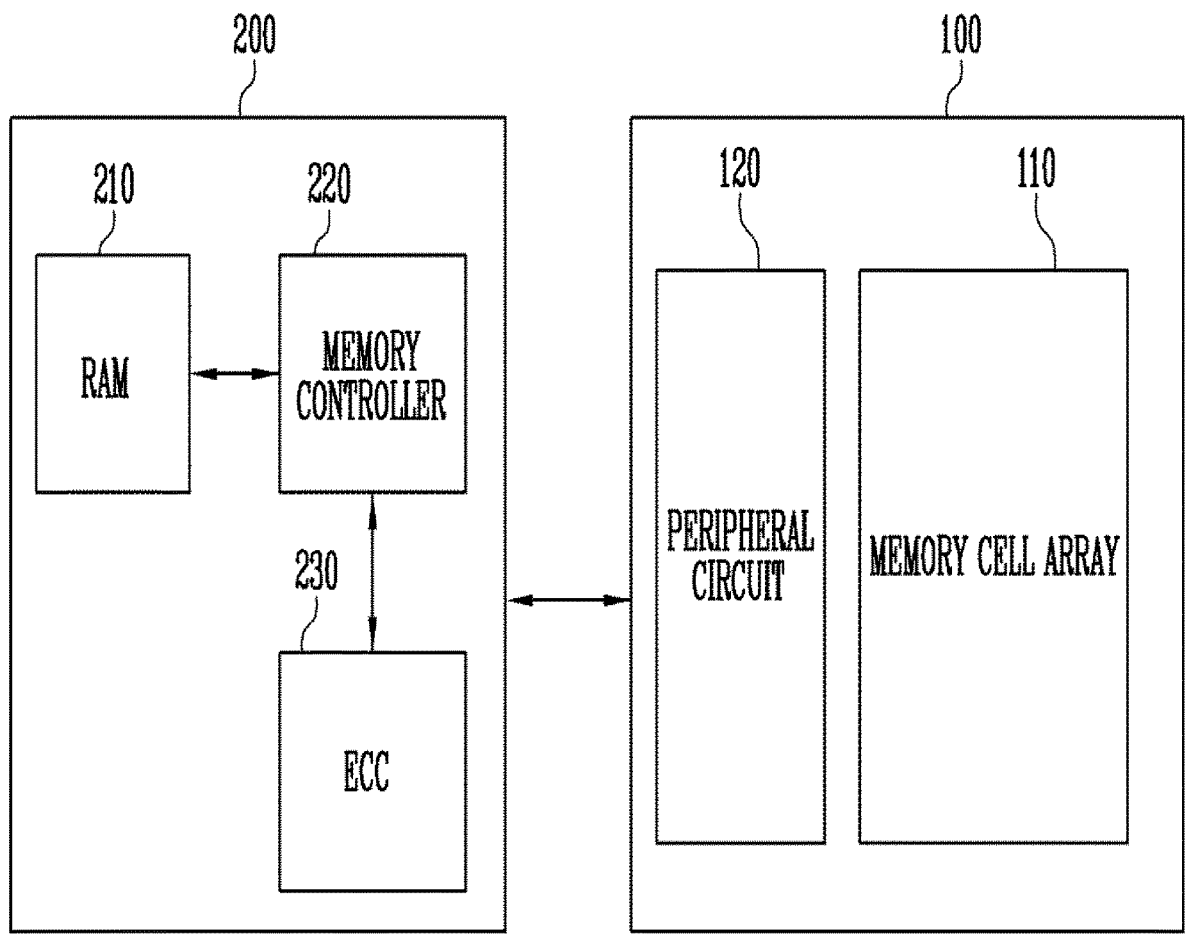
FIG. 1 is a block diagram illustrating a memory system according to an embodiment of the present disclosure.

In the following detailed description, only certain examples of embodiments of the present disclosure have been illustrated and described. As those skilled in the art would realize, the described embodiments may be modified in various different ways, all without departing from the spirit or scope of the present disclosure. Accordingly, the drawings and description are to be regarded as illustrative in nature and not restrictive.

In the entire specification, when an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

Embodiments may provide for a memory system and a method for operating a semiconductor memory device, of which reliability may be improved.

Examples of embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the examples of embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIG. 1 is a block diagram illustrating a memory system according to an embodiment of the present disclosure.

Referring to FIG. 1, the memory system 50 includes a semiconductor memory device 100 and a controller 200.

The semiconductor memory device 100 operates in response to the control of the controller 200. The semiconductor memory device 100 includes a memory cell array 110 and a peripheral circuit 120 for driving the memory cell array 110. The memory cell array 110 includes a plurality of nonvolatile memory cells.

The peripheral circuit 120 operates in response to the control of the controller 200. The peripheral circuit 120 programs data to the memory cell array 110 in response to the control of the controller 200. The peripheral circuit 120 is configured to read data from the memory cell array 110 and erase data of the memory cell array 110.

In an embodiment, read and program operations of the semiconductor memory device 100 may be performed in units of pages. An erase operation of the semiconductor memory device 100 may be performed in units of memory blocks.

In the program operation, the peripheral circuit 120 may receive a program command indicating the program operation, a physical block address, and write data from the controller 200. One memory block and one page included therein may be selected by the physical block address. The peripheral circuit 120 may program the write data in the selected page.

In the read operation, the peripheral circuit 120 may receive a command (hereinafter, referred to as a read command) indicating the read operation and a physical block address from the controller 200. One memory block and one page included therein may be selected by the physical block address. The peripheral circuit 120 may read data from the selected page and output the read data (hereinafter, referred to as a page data) to the controller 200.

In the erase operation, the peripheral circuit 120 may receive a command indicating the erase operation and a physical block address from the controller 200. The physical block address may specify one memory block. The peripheral circuit 120 may erase data of a memory block corresponding to the physical block address.

The semiconductor memory device 100 is a nonvolatile memory device. In an embodiment, the semiconductor memory device 100 may be a flash memory device.

The controller 200 controls overall operations of the semiconductor memory device 100. The controller 200 is configured to access the semiconductor memory device 100 in response to a request from an external host.

The controller 200 includes a random access memory RAM 210, a memory controller 220, and an error correction block 230 (i.e., error-correcting code (ECC)).

The RAM 210 operates in response to the control of the memory controller 220. The memory controller 220 is configured to control read, write, erase, and background operations of the semiconductor memory device 100. The memory controller 220 is configured to drive firmware for controlling the semiconductor memory device 100. In an embodiment, the controller may be implemented with hardware, software, or any combination thereof.

When a host transmits a read request, the memory controller 220 may provide a read command to the semiconductor memory device 100 to identify data of a page (i.e., a selected page) corresponding to the read request. The memory controller 220 may convert a logical block address included in the read request into a physical block address. In an embodiment, the memory controller 220 may perform a function of a flash translation layer (FTL). The memory controller 220 may provide the generated physical block address to the semiconductor memory device 100 together with the read command.

In response to the read command, the semiconductor memory device 100 reads page data from the selected page, and transmits the read page data to the controller 200. The error correction block 230 determines whether an error is included in the page data in response to the control of the memory controller 220. For example, the controller 200 may decode the page data according to an error correction code. It will be understood that various methods may be used for the error correction code. For example, it will be understood that error correction codes using various methods such as Bose-Chaudhri-Hocquenghem code (BCH code), a Reed Solomon code, a Hamming code, and a low density parity check code (LDPC code) may be used. When a predetermined number or more of error bits are included in the page data, decoding may fail. When a predetermined number or less of error bits are included in the page data, decoding may succeed.

The success of the decoding may mean that the corresponding read command passes. The failure of the decoding may mean that the corresponding read command fails. When the decoding is successful, the controller 200 may output, to the host, the page data of which error has been corrected.

Figure 2:
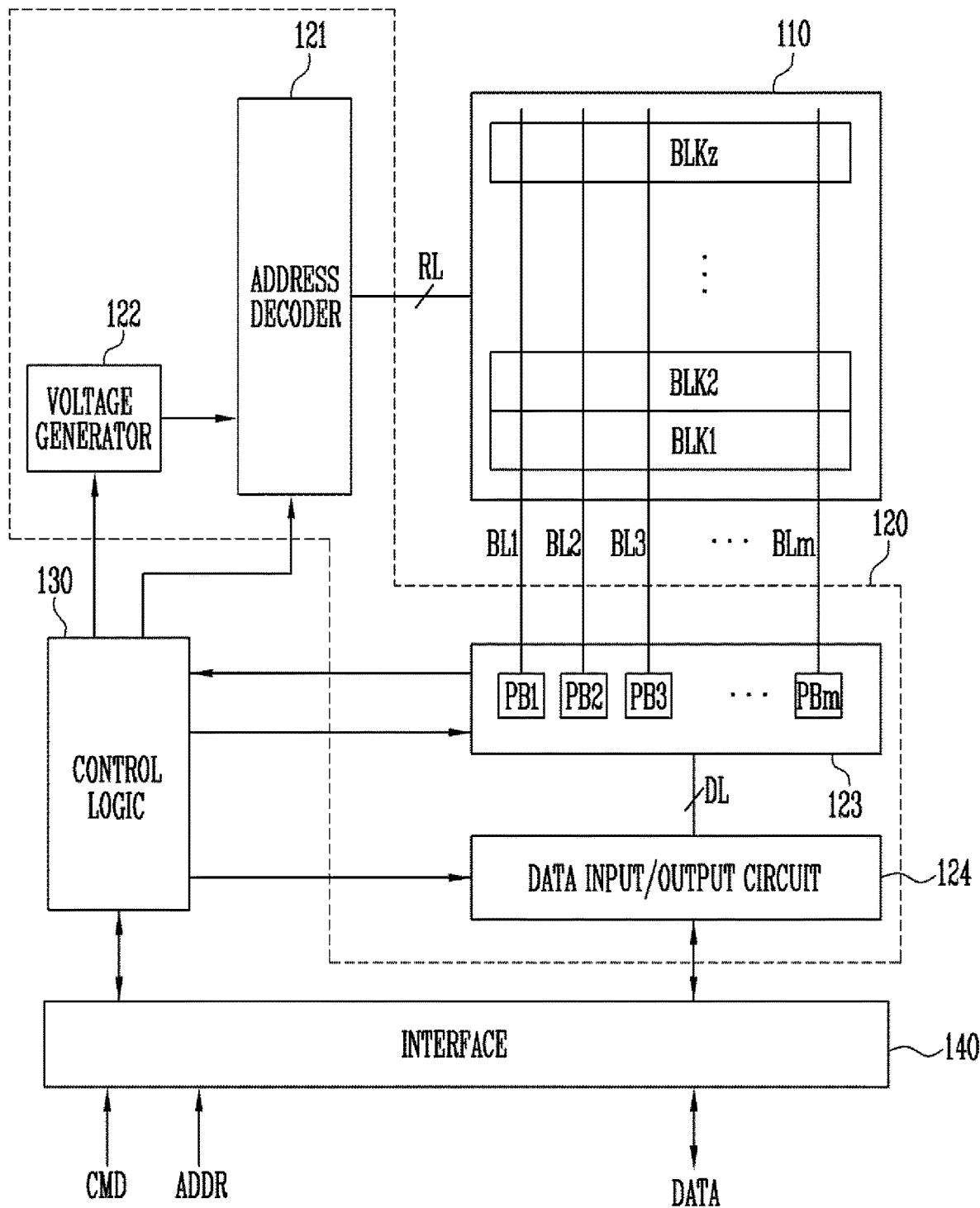
FIG. 2 is a block diagram illustrating a structure of a semiconductor memory device of FIG. 1.

FIG. 2 is a block diagram illustrating a structure of the semiconductor memory device 100 of FIG. 1.

Referring to FIG. 2, the semiconductor memory device 100 may include a memory cell array 110, a peripheral circuit 120, a control logic 130, and an interface 140.

The memory cell array 110 may be coupled to an address decoder 121 through row lines RL. In an embodiment, for example, the row lines RL may include source select lines SSL, word lines WL, and drain select lines DSL. The memory cell array 110 may be coupled to a data input and output (input/output) circuit 124 through bit lines BL (i.e. BL1 to BLm), a read and write (read/write) circuit 123, and data lines DL.

The memory cell array 110 includes a plurality of memory blocks BLK1 to BLKz. The plurality of memory blocks BLK1 to BLKz are coupled to the address decoder 121 through row lines RL. The plurality of memory blocks BLK1 to BLKz are coupled to a read/write circuit 123 through bit lines BL1 to BLm. Each of the plurality of memory blocks BLK1 to BLKz includes a plurality of memory cells. In an embodiment, the plurality of memory cells are nonvolatile memory cells. Among the plurality of memory cells, memory cells coupled to the same word line are defined as one page. That is, the memory cell array 110 is configured with a plurality of pages.

In some embodiments, the memory cell array 110 may include at least one memory plane. Each memory plane may include a plurality of memory blocks. The memory plane included in the memory cell array 110 will be described later with reference to FIG. 5.

Each of the memory cells of the semiconductor memory device 100 may be configured as a single level cell (SLC) for storing one bit of data, a multi-level cell (MLC) for storing two bits of data, a triple level cell (TLC) for storing three bits of data, or a quad level cell (QLC) for storing four bit of data.

The peripheral circuit 120 may include the address decoder 121, a voltage generator 122, the read/write circuit 123, and the data input/output circuit 124.

The peripheral circuit 120 drives the memory cell array 110. For example, the peripheral circuit 120 may drive the memory cell array 120 to perform program, read, and erase operations.

The address decoder 121 is coupled to the memory cell array 110 through the row lines RL. The address decoder 121 is configured to operate in response to the control of the control logic 130. The address decoder 121 receives an address ADDR through an input/output buffer (not illustrated) provided in the semiconductor memory device 100.

The address decoder 121 is configured to decode a block address in the received address ADDR. The address decoder 121 selects at least one memory block among the memory blocks BLK1 to BLKz according to the decoded block address. The address decoder 121 is configured to decode a row address in the received address ADDR. The address decoder 121 may select at least one word line WL of the selected memory block by applying voltages provided from the voltage generator 122 to the word line WL according to the decoded row address.

In a program operation, the address decoder 121 may apply a program voltage to the selected word line, and apply a pass voltage having a level lower than that of the program voltage to unselected word lines. In a program verify operation, the address decoder 121 may apply a verify voltage to the selected word line, and apply a verify pass voltage higher than the verify voltage to the unselected word lines.

In a read operation, the address decoder 121 may apply a read voltage to the selected word line, and apply a pass voltage higher than the read voltage to the unselected word lines.

In an embodiment, an erase operation of the semiconductor memory device 100 is performed in units of memory blocks. An address ADDR input to the semiconductor memory device 100 in the erase operation includes a block address. The address decoder 121 may decode the block address, and select one memory block according to the decoded block address. In the erase operation, the address decoder 121 may apply a ground voltage to a word line input to the selected memory block.

In an embodiment, the address decoder 121 may be configured to decode a column address in the address ADDR transmitted thereto. The decoded column address DCA may be transmitted to the read/write circuit 123. In an example of an embodiment, the address decoder 121 may include components such as a row decoder, a column decoder, and an address buffer.

The voltage generator 122 is configured to generate a plurality of voltages by using an external power voltage supplied to the semiconductor memory device 100. The voltage generator 122 operates in response to the control of the control logic 130.

In an embodiment, the voltage generator 122 may generate an internal power voltage by regulating the external power voltage. The internal power voltage generated by the voltage generator 122 is used as an operating voltage of the semiconductor memory device 100.

In an embodiment, the voltage generator 122 may generate a plurality of voltages by using the external power voltage or the internal power voltage. The voltage generator 122 may be configured to generate various voltages required by the semiconductor memory device 100. For example, the voltage generator 122 may generate a plurality of program voltages, a plurality of pass voltages, a plurality of select read voltages, and a plurality of unselect read voltages.

For example, the voltage generator 122 may include a plurality of pumping capacitors for receiving the internal power voltage, and generate a plurality of voltages by selectively activating the plurality of pumping capacitors in response to the control of the control logic 130.

The plurality of generated voltages may be supplied to the memory cell array 110 by the address decoder 121.

The read/write circuit 123 includes first to mth page buffers PB1 to PBm. The first to mth page buffers PB1 to PBm are coupled to the memory cell array 110 through the respective first to mth bit lines BL1 to BLm. The first to mth page buffers PB1 to PBm operate in response to the control of the control logic 130.

The first to mth page buffers PB1 to PBm communicate data with the data input/output circuit 124. In a program operation, the first to mth page buffers PB1 to PBm receive data DATA to be stored through the data input/output circuit 124 and data lines DL.

In a program operation, the first to mth page buffers PB1 to PBm may transmit, to selected memory cells, the data DATA to be stored, which is received through the data input/output circuit 124, when a program pulse is applied to a selected word line. The memory cells of the selected page may be programmed according to the transmitted data DATA. A memory cell coupled to a bit line to which a program permission voltage (e.g., a ground voltage) is applied may have an increased threshold voltage. The threshold voltage of a memory cell coupled to a bit line to which a program prohibition voltage (e.g., a power voltage) is applied may be maintained. In a program verify operation, the first to mth page buffers PB1 to PBm read page data from the selected memory cells through the bit lines BL1 to BLm.

In a read operation, the read/write circuit 123 reads data DATA from memory cells of a selected page through the bit lines BL, and outputs the read data DATA to the data input/output circuit 124.

In an erase operation, the read/write circuit 123 may float the bit lines BL. In an embodiment, the read/write circuit 123 may include a column select circuit.

The data input/output circuit 124 is coupled to the first to mth page buffers PB1 to PBm through the data lines DL. The data input/output circuit 124 operates in response to the control of the control logic 130. In a program operation, the data input/output circuit 124 may receive data DATA to be stored from an external controller (not illustrated). In a read operation, the data input/output circuit 124 outputs, to the external controller, data transmitted from the first to mth page buffers PB1 to PBm included in the read/write circuit 123.

The control logic 130 may be coupled to the address decoder 121, the voltage generator 122, the read/write circuit 123, and the data input/output circuit 124. The control logic 130 may be configured to control overall operations of the semiconductor memory device 100. The control logic 130 may operate in response to a command CMD transmitted from an external device.

The interface 140 may interface data (DATA) communication between the semiconductor memory device 100 and the external device. The interface 140 may include a NAND interface or a NOR interface depending on the kind of the semiconductor memory device 100.

Figure 3:
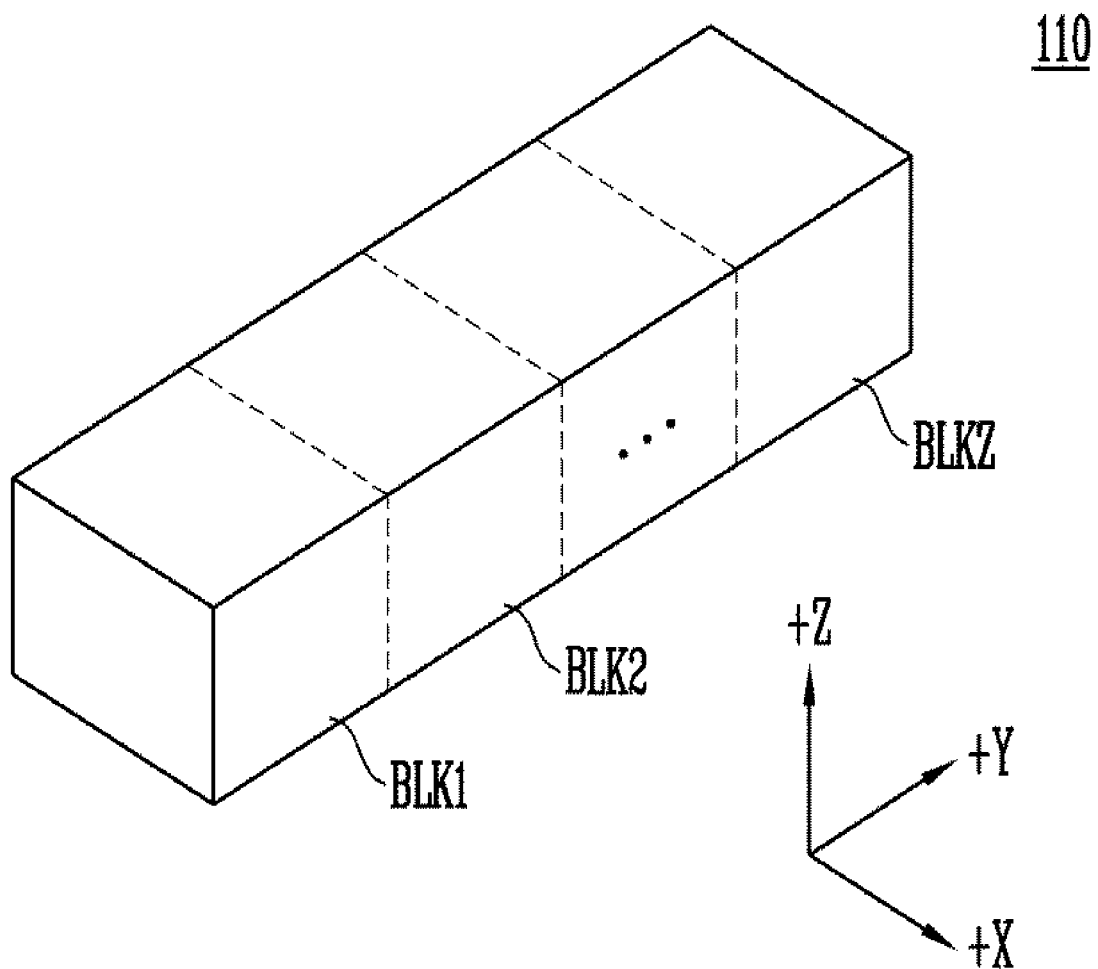
FIG. 3 is a block diagram illustrating an embodiment of a memory cell array of FIG. 2.

FIG. 3 is a block diagram illustrating an embodiment of the memory cell array of FIG. 2.

Referring to FIG. 3, the memory cell array 110 includes a plurality of memory blocks BLK1 to BLKz. Each memory block may have a three-dimensional structure. Each memory block includes a plurality of memory cells stacked on a substrate. The plurality of memory cells are arranged along +X, +Y, and +Z directions. Each memory block having a three-dimensional structure will be described with reference to FIGS. 4 and 5. According to an embodiment of the present disclosure, each memory block may have a two-dimensional structure. In this case, a plurality of memory cells in each memory block may be arranged along +X and +Y directions.

Figure 4:
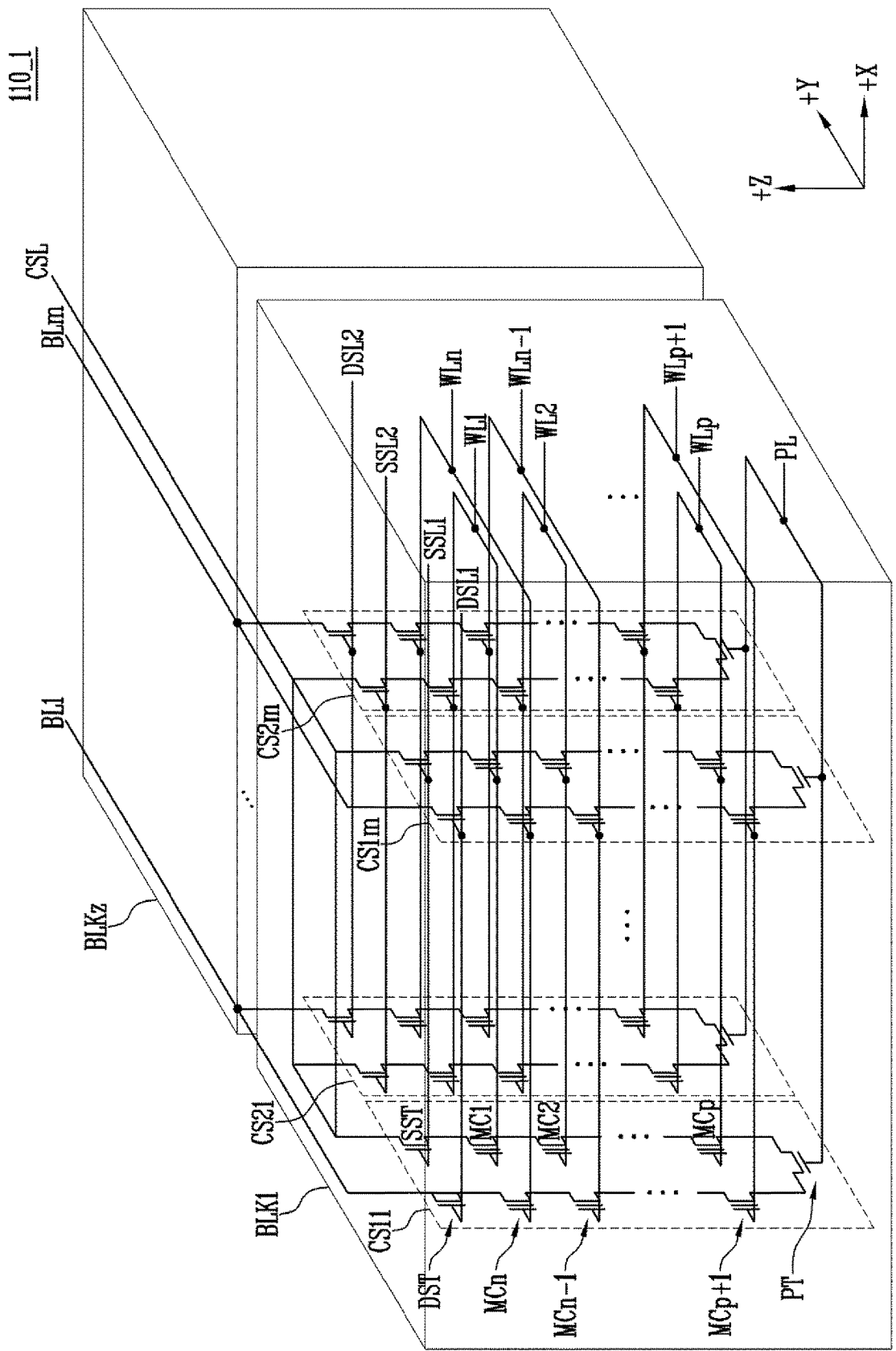
FIG. 4 is a diagram illustrating an embodiment of the memory cell array of FIG. 2.

FIG. 4 is a diagram illustrating an embodiment 110_1 of the memory cell array 110 of FIG. 2.

Referring to FIG. 4, the memory cell array 110_1 includes a plurality of memory blocks BLK1 to BLKz. In FIG. 4, for convenience of description, an internal configuration of a first memory block BLK1 is illustrated, and internal configurations of the other memory blocks BLK2 to BLKz are omitted. It will be understood that second to zth memory blocks BLK2 to BLKz are also configured identically to the first memory block BLK1.

The first memory block BLK1 includes a plurality of cell strings CS11 to CS1m and CS21 to CS2m. In an embodiment, each of the plurality of cell strings CS11 to CS1m and CS21 to CS2m may be formed in a 'U' shape. In the first memory block BLK1, m cell strings are arranged in a row direction (i.e., a +X direction). In FIG. 4, it is illustrated that two cell strings are arranged in a column direction (i.e., a +Y direction). However, this is for convenience of description, and it will be understood that three cell strings may be arranged in the column direction. For example, four cell strings arranged in the column direction (i.e., the +Y direction) may be included in each of the memory blocks of the memory cell array 110_1. Meanwhile, in this specification, m cell strings arranged in the column direction (i.e., the +Y direction) is designated as one string group. That is, the cell strings CS11 to CS1m may be designated as a first string group, and the cell strings CS21 to CS2m may be designated as a second string group.

Each of the plurality of cell strings CS11 to CS1m and CS21 to CS2m includes at least one source select transistor SST, first to nth memory cells MC1 to MCn, a pipe transistor PT, and at least one drain select transistor DST.

The select transistors SST and DST and the memory cells MC1 to MCn may have structures similar to one another. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is coupled between a common source line CSL and memory cells MC1 to MCp.

In an embodiment, the source select transistors of cell strings arranged on the same row are coupled to a source select line extending in the row direction, and the source select transistors of cell strings arranged on different rows are coupled to different source select lines. In FIG. 4, the source select transistors of the cell strings CS11 to CS1m on a first row are coupled to a first source select line SSL1. The source select transistors of the cell strings CS21 to CS2m on a second row are coupled to a second source select line SSL2.

In an embodiment, the source select transistors of the cell strings CS11 to CS1m and CS21 to CS2m may be commonly coupled to one source select line.

The first to nth memory cells MC1 to MCn of each cell string are coupled between the source select transistor SST and the drain select transistor DST.

The first to nth memory cells MC1 to MCn may be divided into first to pth memory cells MC1 to MCp and a (p+1)th to nth memory cells MCp+1 to MCn. The first to pth memory cells MC1 to MCp are sequentially arranged in the opposite direction of a +Z direction, and are coupled in series between the source select transistor SST and the pipe transistor PT. The (p+1)th to nth memory cells MCp+1 to MCn are sequentially arranged in the +Z direction, and are coupled in series between the pipe transistor PT and the drain select transistor DST. The first to pth memory cells MC1 to MCp and the (p+1)th to nth memory cells MCp+1 to MCn are coupled through the pipe transistor PT. Gate electrodes of the first to nth memory cells MC1 to MCn of each cell string are coupled to first to nth word lines WL1 to WLn, respectively.

A gate of the pipe transistor PT of each cell string is coupled to a pipe line PL.

The drain select transistor DST of each cell string is coupled between a corresponding bit line and the memory cells MCp+1 to MCn. Cell strings arranged in the row direction are coupled to a drain select line extending in the row direction. The drain select transistors of the cell strings CS11 to CS1m on the first row are coupled to a first drain select line DSL1. The drain select transistors of the cell strings CS21 to CS2m on the second row are coupled to a second drain select line DSL2.

Cell strings arranged in the column direction are coupled to a bit line extending in the column direction. In FIG. 4, the cell strings CS11 and CS21 on a first column are coupled to a first bit line BL1. The cell strings CS1m and CS2m on an mth column are coupled to an mth bit line BLm.

Memory cells coupled to the same word line in the cell strings arranged in the row direction constitute one page. For example, memory cells coupled to the first word line WL1 in the cell strings CS11 to CS1m on the first row constitute one page. Memory cells coupled to the first word line WL1 in the cell strings CS21 to CS2m on the second row constitute another page. That is, memory cells arranged in the +X direction to be coupled to the same word line constitute one page. As any one of the drain select lines DSL1 and DSL2 is selected, cell strings arranged in one row direction may be selected. As any one of the word lines WL1 to WLn is selected, one page may be selected in the selected cell strings.

Figure 5:
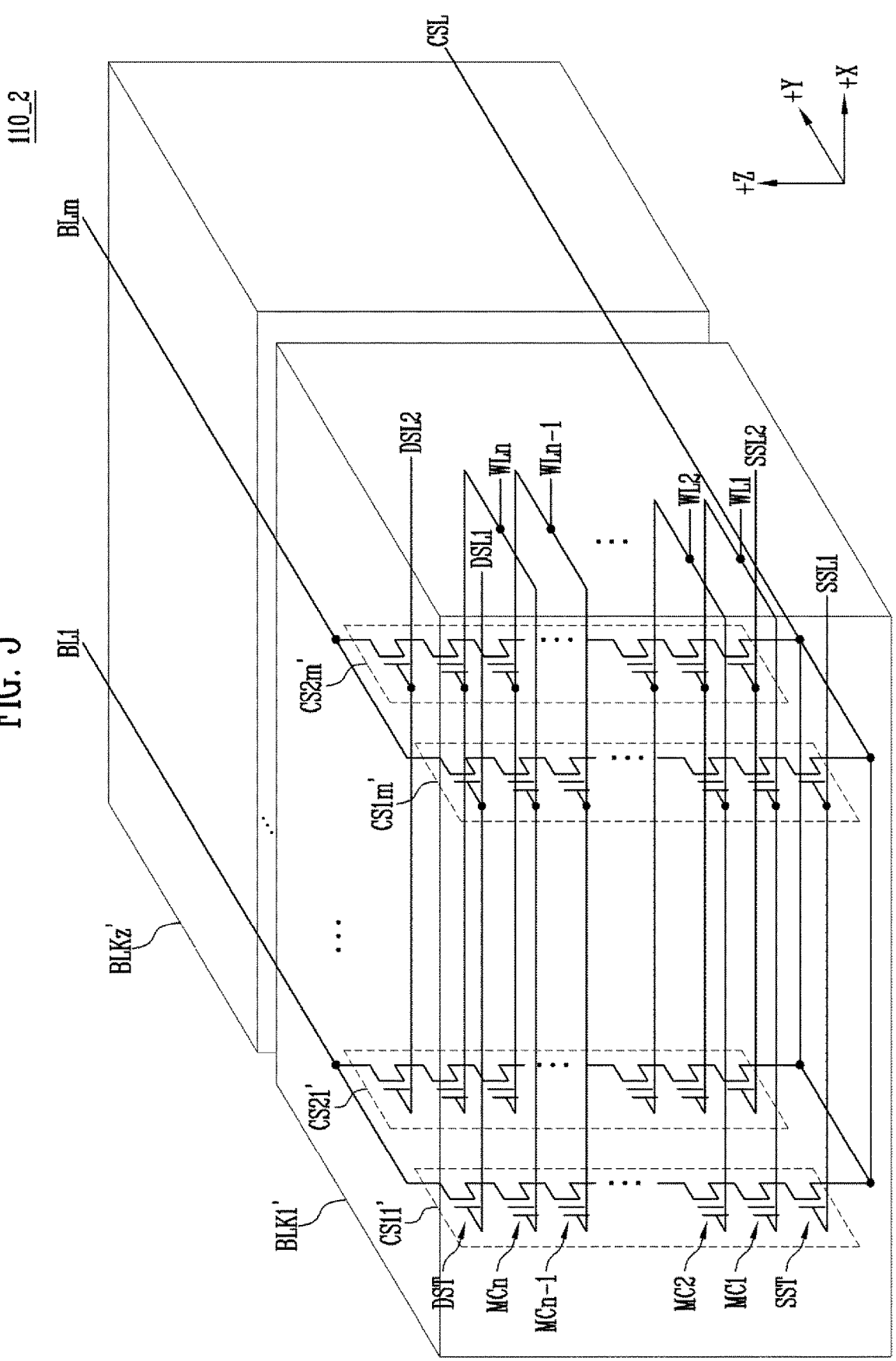
FIG. 5 is a diagram illustrating another embodiment of the memory cell array of FIG. 2.

FIG. 5 is a diagram illustrating an embodiment 110_2 of the memory cell array 100 of FIG. 2.

Referring to FIG. 5, the memory cell array 110_2 includes a plurality of memory blocks BLK1' to BLKz'. In FIG. 5, for convenience of description, an internal configuration of a first memory block BLK1' is illustrated, and internal configurations of the other memory blocks BLK2' to BLKz' are omitted. It will be understood that second to zth memory blocks BLK2' to BLKz' are also configured identically to the first memory block BLK1.

The first memory block BLK1' includes a plurality of cell strings CS11' to CS1m' and CS21' to CS2m'. Each of the plurality of cell strings CS11' to CS1m' and CS21' to CS2m' extends along the +Z direction. In the first memory block BLK1', m cell strings are arranged in the +X direction. In FIG. 5, it is illustrated that two cell strings are arranged in the +Y direction. However, this is for convenience of description, and it will be understood that three cell strings may be arranged in the column direction. For example, four cell strings arranged in the column direction (i.e., the +Y direction) may be included in each of the memory blocks of the memory cell array 110_2.

Each of the plurality of cell strings CS11' to CS1m' and CS21' to CS2m' includes at least one source select transistor SST, first to nth memory cells MC1 to MCn, and at least one drain select transistor DST.

The source select transistor SST of each cell string is coupled between a common source line CSL and the memory cells MC1 to MCn. The source select transistors of cell strings arranged on the same row are coupled to the same source select line. The source select transistors of the cell strings CS11' to CS1m' arranged on a first row are coupled to a first source select line SSL1. Source select transistors of the cell strings CS21' to CS2m' arranged on a second row are coupled to a second source select line SSL2. In an embodiment, the source select transistors of the cell strings CS11' to CS1m' and CS21' to CS2m' may be commonly coupled to one source select line.

The first to nth memory cells MC1 to MCn of each cell string are coupled in series between the source select transistor SST and the drain select transistor DST. Gate electrodes of the first to nth memory cells MC1 to MCn are coupled to first to nth word lines WL1 to WLn, respectively.

The drain select transistor DST of each cell string is coupled between a corresponding bit line and the memory cells MC1 to MCn. The drain select transistors of cell strings arranged in the row direction are coupled to a drain select line extending in the row direction. The drain select transistors of the cell strings CS11' to CS1m' on the first row are coupled to a first drain select line DSL1. The drain select transistors of the cell strings CS21' to CS2m' on the second row are coupled to a second drain select line DSL2.

Memory cells coupled to the same word line in the cell strings arranged in the row direction constitute one page. For example, memory cells coupled to the first word line WL1 in the cell strings CS11' to CS1m' on the first row constitute one page. Memory cells coupled to the first word line WL1 in the cell strings CS21' to CS2m' on the second row constitute another page. That is, memory cells arranged in the +X direction to be coupled to the same word line constitute one page. As any one of the drain select lines DSL1 and DSL2 is selected, cell strings arranged in one row direction may be selected. As any one of the word lines WL1 to WLn is selected, one page may be selected in the selected cell strings. A relationship between memory cells coupled to the same word line and a page will be described later with reference to FIG. 7.

Consequently, the memory block BLK1' of FIG. 5 has an equivalent circuit similar to that of the memory block BLK1 of FIG. 4, except that the pipe transistor PT is excluded from each cell string.

Figure 6:
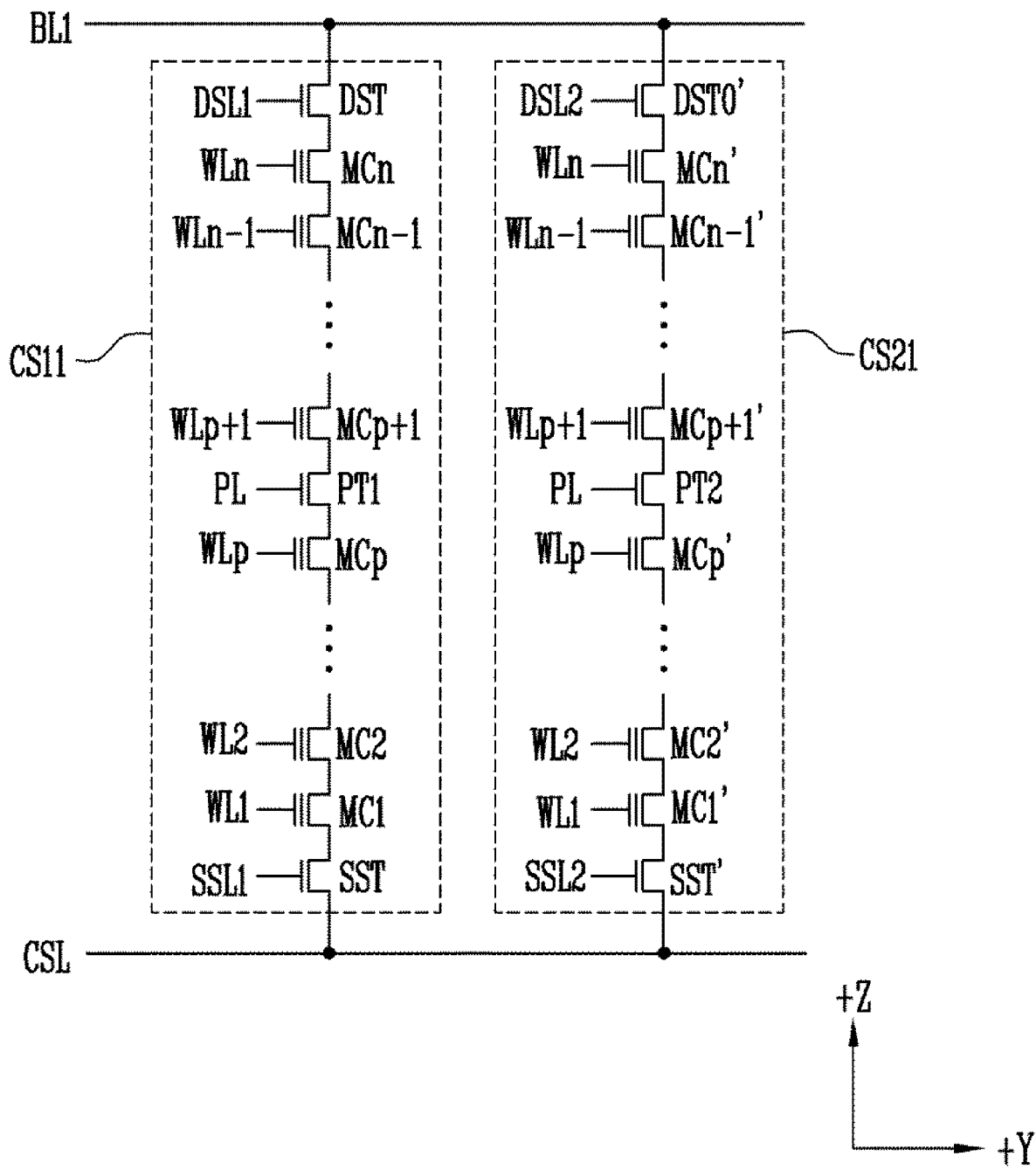
FIG. 6 is a circuit diagram illustrating a portion of the memory cell array of FIG. 4.

FIG. 6 is a circuit diagram illustrating a portion of the memory cell array of FIG. 4.

Referring to FIG. 6, two cell strings CS11 and CS21 among the cell strings of FIG. 4 are illustrated. That is, in the memory block and the cell strings of FIG. 4, two cell strings CS11 and CS21 viewed in the +X direction are illustrated. In FIG. 4, it is illustrated that each of the cell strings CS11 and CS21 has a U shape. However, in FIG. 6, it is illustrated that, for convenience of description, each of the cell strings CS11 and CS21 has a straight line shape. The cell string CS11 includes a drain select transistor DST, memory cells MC1 to MCn, and a pipe transistor PT1. In addition, the cell string CS21 includes a drain select transistor DST0', memory cells MCV to MCn', and a pipe transistor PT2. The pipe transistors PT1 and PT2 are located at middle ends of the cell strings CS11 and CS21, respectively. As described above, it may be defined that the cell strings CS11 to CS1m belong to a first string group and the cell strings CS21 to CS2m belong to a second string group. The cell string CS11 belonging to the first string group and the cell string CS21 belonging to the second string group are illustrated in FIG. 6. However, as illustrated in FIG. 4, the cell strings CS12 to CS1m belonging to the first string group and the cell strings CS22 to CS2m exist in the +X direction. As described above, the memory cells coupled to the same word line among the cell strings CS11 to CS1m belonging to the first string group constitute one page. In addition, the memory cells coupled to the same word line among the cell strings CS21 to CS2m belonging to the first string group constitute one page. That is, the memory cells arranged in the +X direction to be coupled to the same word line constitute one page. Memory cells that are coupled to the same word line but belong to different string groups do not constitute one page. For example, in FIG. 6, since the two memory cells MC1 and MCV coupled to the first word line WL1 belong to different string groups, the two memory cells MC1 and MCV do not constitute one page. A relationship between memory cells coupled to the same word line and a page will be described later with reference to FIG. 7.

Figure 7:
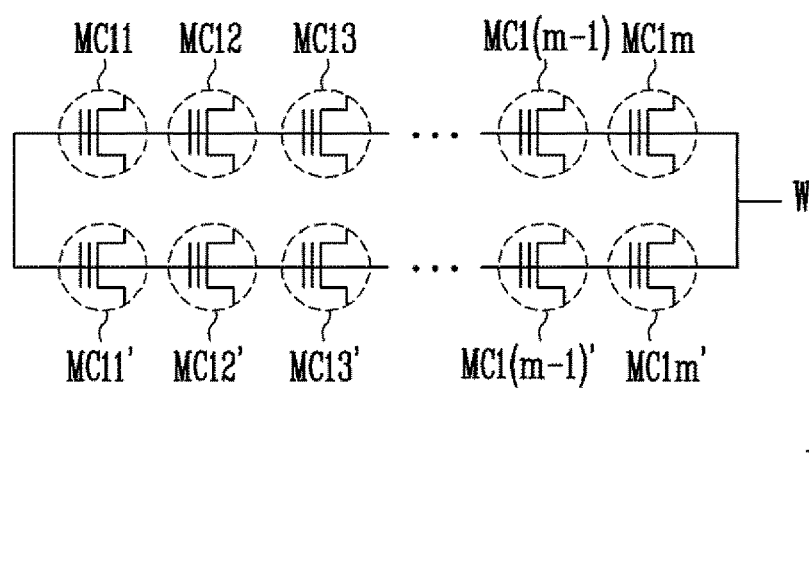
FIG. 7 is a diagram illustrating a relationship between pages and cell strings of FIG. 6.

FIG. 7 is a diagram illustrating a relationship between pages and cell strings of FIG. 6.

Referring to FIG. 7, in the structure of the memory cell array of FIG. 4, a page viewed in the +Z direction is illustrated. Referring together to FIGS. 6 and 7, pages coupled to the first word line WL1 are illustrated. For convenience of illustration, the memory cells MC1 and MC1' of FIG. 6 are designated as memory cells MC11 and MC11' in FIG. 7. Referring together to FIGS. 4, 6, and 7, the memory cells MC11 to MC1$m$ are included in the cell strings CS11 to CS1$m$, respectively. Meanwhile, the memory cells MC11' to MC1$m$' are included in the cell strings CS21 to CS2$m$, respectively.

The memory cells MC11 to MC1$m$ and the memory cells MC11' to MC1$m$' are all coupled to the same first word line WL1, but not the same page. That is, among the memory cells MC11 to MC1$m$ and MC11' to MC1$m$' coupled to the first word line WL1, the memory cells MC11 to MC1$m$ belonging to the first string group constitute one page, and the memory cells MC11' to MC1$m$' belonging to the second string group constitute another page. Read and write operations of a general semiconductor memory device are performed in units of pages, and therefore, the differentiation of memory cells according to the above-described page configuration is meaningful.

Referring together to FIGS. 4, 6, and 7, the cell strings CS11 to CS1$m$ belonging to the first string group are first programmed in a program operation. During the program operation of the cell strings CS11 to CS1$m$, the cell strings CS21 to CS2$m$ belonging to the second string group are maintained in an erase state.

After the cell strings CS11 to CS1$m$ belonging to the first string group are programmed, the cell strings CS21 to CS2$m$ belonging to the second string group are programmed. From the viewpoint of FIG. 7, the memory cells MC11' to MC1$m$' are programed after the memory cells MC11 to MC1$m$ are programmed. In a memory cell array having a three-dimensional structure as illustrated in FIGS. 3 to 5, a failure may occur in a charge trap nitride (CTN) layer in which program data is stored during a manufacturing process. In this case, a memory cell including the failure of the CTN layer is not normally programmed in a program operation. Therefore, a program pulse is relatively applied a plural number of times, or a program fail occurs. In this case, the threshold voltage of an adjacent memory cell coupled to the same word line may be influenced. In the present disclosure, when a program pulse is applied a certain number of times or more to program a selected page, error bits are checked by reading data of an adjacent page coupled to the same word line, and a subsequent operation such as data backup is performed by checking a read fail probability. Accordingly, it is possible to provide a more reliable semiconductor memory device.

In the embodiment illustrated in FIG. 6, the drain select transistors DST and DST0' of the cell strings CS11 and SC21 are coupled to the same bit line BL1. However, this is merely an embodiment of the present disclosure. In some embodiments, a cell string belonging to the first string group and a cell string belonging to the second string group may be coupled to different bit lines, respectively. In this case, the bit line coupled to the cell string belonging to the first string group and the bit line coupled to the cell string belonging to the second string group can be driven independently from each other, and the bit lines can be individually controlled.

Figure 8:
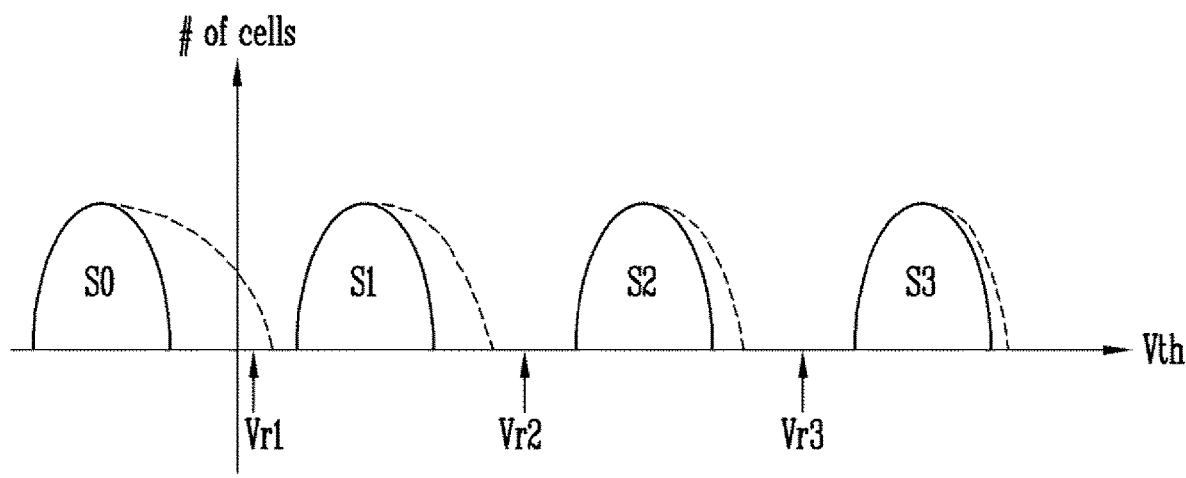
FIG. 8 is a diagram illustrating a change in threshold voltage of an adjacent string group as a program pulse is applied.

FIG. 8 is a diagram illustrating a change in threshold voltage of an adjacent string group as a program pulse is applied. A case where memory cells are MLCs that each stores two bits of data.

Referring together to FIGS. 7 and 8, there is illustrated a change in threshold voltage of a memory cell belonging to a second page coupled to the same word line WL1 when a program pulse is excessively applied while the memory cells MC11' to MC1$m$' belonging to a first page are being programmed.

For convenience of description, a situation will be assumed in which a program operation is performed on a page including the memory cell MC1' of the cell string CS21 among the memory cells illustrated in FIG. 6. From the viewpoint of FIG. 7, the situation may be a situation in which the memory cells MC11' to MC1$m$' belonging to the first page are programmed. The cell strings CS11 to CS1$m$ have been completely programmed, and therefore, a program operation performed on the memory cells MC1 to MC$n$ belonging to the cell string CS11 in FIG. 6 may be completed. From the viewpoint of FIG. 7, data has already been stored in the page including the memory cells MC11 to MC1$m$. That is, the memory cells MC11 to MC1$m$ belonging to the second page have any one state among an erase state S0 and first to third states S1 to S3.

The memory cells MC11 to MC1$m$ belonging to the second page and the memory cells MC11' to MC1$m$' belonging to the first page are all coupled to the same word line WL1. Therefore, while data is being programmed in the first page including the memory cells MC11' to MC1$m$', the memory cells MC11 to MC1$m$ belonging to the adjacent second page may be influenced by the program operation of the first page due to the word line WL1 even when the memory cells MC11 to MC1$m$ are in a program prohibition state. For example, the program pulse is also applied to the word line WL1 coupled to the gate electrodes of the memory cells MC11 to MC1$m$, and therefore, the threshold voltages of the memory cells MC11 to MC1$m$ may be changed. For example, as the program pulse is applied to the word line WL1 to perform the program operation of the first page, the threshold voltages of the memory cells MC11 to MC1$m$ included in the second page may be changed from the range indicated by a solid line to the range indicated by a dotted line.

Accordingly, as illustrated in FIG. 8, when the threshold voltage of a memory cell in the erase state S0 among the memory cells MC11 to MC1$m$ belonging to the second page is changed to a value larger than a first read voltage Vr1, error bits may be generated in data stored in the corresponding memory cell. According to the illustration of FIG. 7, when data is read at a second or third read voltage Vr2 or Vr3 as the change in threshold voltage in the first or second program state S1 or S2 is small, any error bit does not generate in the corresponding program state. However, the illustration of FIG. 7 is illustrative. In some situations, error bits may be generated in the corresponding program state as the change in threshold voltage in the first or second program state S1 or S2 is increased.

Generally, in a program operation, any error bit check is not performed on data of an adjacent page coupled to the word line. Therefore, as the number of error bits increases in a subsequent read operation, a read fail may occur, which becomes a factor that lowers the reliability of a semiconductor memory device. In an embodiment, for example, the error bit check may be performed by the controller 200.

In the semiconductor memory device according to the present disclosure, when the program pulse is applied a certain number of times or more, error bits are checked by reading data of an adjacent page coupled to the same word line, and accordingly, a read fail probability is checked. Thus, it is possible to provide a more reliable semiconductor memory device. In this specification, corresponding data determined that the read fail probability is high during the program operation may be stored at another position of the memory cell array.

Figure 9:
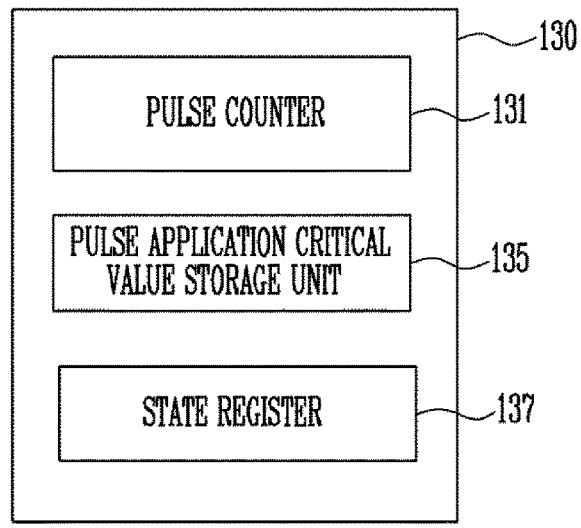
FIG. 9 is a block diagram illustrating an embodiment of a control logic of FIG. 2.

FIG. 9 is a block diagram illustrating an embodiment of the control logic 130 of FIG. 2.

Referring to FIG. 9, the control logic 130 included in the semiconductor memory device according to an embodiment of the present disclosure may include a pulse counter 131, a pulse application critical value storage unit 135, and a state register 137. In an embodiment, the control logic 130, pulse counter 131, pulse application critical value storage unit 135, and state register 137 may be implemented with hardware, software, or any combination thereof. The pulse counter 131 may count the number of times of applying a program pulse applied to a selected word line in a program operation performed on the memory cell array. The pulse application critical value storage unit 135 may store a first critical value for determining a time when error bits are checked on data of an adjacent page during the program operation. As will be described later, in the semiconductor memory device according to the present disclosure, when the number of times of applying the program pulse in a program operation performed on the first page exceeds the first critical value, data of the adjacent second page is read and then transmitted to the controller, thereby checking error bits. Thus, a read fail probability is checked. Accordingly, the reliability of the semiconductor memory device is improved.

The pulse application critical value storage unit 135 may further store a second critical value in addition to the first critical value. The second critical value is the number of times of applying a program pulse maximally applied in the program operation. That is, when data is not programmed in the corresponding memory cell even though the program pulse is applied the number of times, i.e., the second critical value, this is determined as a program fail. In this case, the corresponding memory cell may be treated as a failure, and the data is programmed in a memory cell located at another position.

The state register 137 may store data representing a current operating state of the semiconductor memory device. When the operating state is changed, the semiconductor memory device updates the data stored in the state register 137. When the controller transmits a state read command to the semiconductor memory device, the semiconductor memory device transmits the data stored in the state register 137 to the controller. Accordingly, the controller can determine the current operating state of the semiconductor memory device, based on the received data. According to the present disclosure, when the number of times of applying the program pulse, which is counted by the pulse counter 131, exceeds the first critical value, the control logic 130 of the semiconductor memory device 100 is configured to update the state register 137. In this case, the state register 137 may be updated to include a code indicating that the number of times of applying the program pulse applied to program the first page has exceeded the first critical value. The controller 200 is configured to check error bits, based on the update.

The second critical value is a numeral larger than the first critical value. Hereinafter, a case where the first critical value is 15 and the second critical value is 20 will be described as an example.

Figure 10:
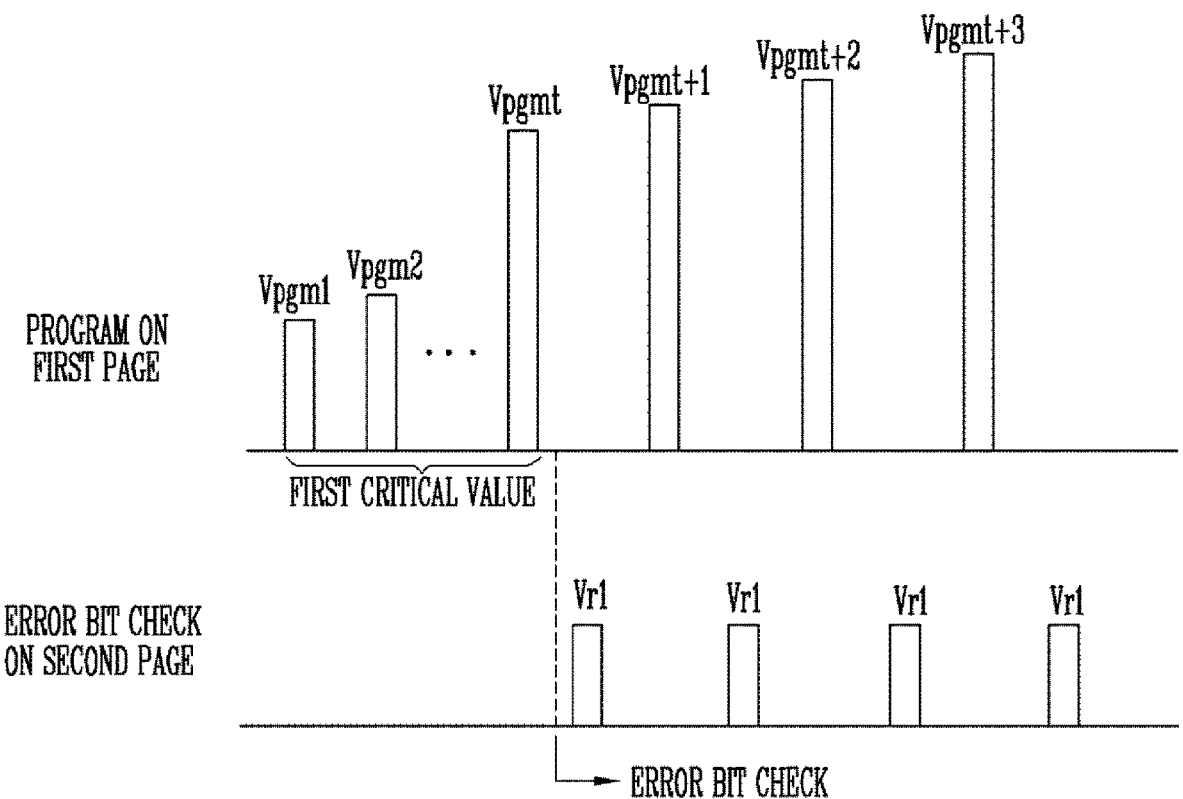
FIG. 10 is a diagram illustrating a program process of the semiconductor memory device according to an embodiment of the present disclosure.

FIG. 10 is a diagram illustrating a program process of the semiconductor memory device according to an embodiment of the present disclosure.

Referring to FIG. 10, there are illustrated program pulses Vpgm1 to Vpgmt+3 applied to memory cells belonging to the selected first page and read voltages Vr1 applied to the adjacent second page coupled to the same word line. Since program and read pulses are all applied to a word line, the program pulses Vpgm1 to Vpgmt+3 and the read voltages Vr1 are applied to the same word line. Referring back to FIGS. 6 and 7, the program pulses Vpgm1 to Vpgmt+3 are applied to the memory cells MC11' to MC1m' of the first page, and the read pulses Vr1 for checking error bits are applied to the memory cells MC11 to MC1m of the second page. However, both of the program pulses Vpgm1 to Vpgmt+3 and the read pulses Vr1 are applied through the word line WL1.

When the number of times of applying the program pulse applied to program the first page is equal to or smaller than the first critical value, any error bit of data of the adjacent second page are not checked. In the above-described example, the case where the first critical value is 15 and the second critical value is 20 has been assumed, and therefore, value t becomes 15. That is, while the program pulse is being applied up to 15 times, any error bit check of the adjacent second page is not performed, and a program operation is performed identically to the typical program operation.

In the above-described example, if the number of times of applying the program pulse becomes 15 times, an error bit check is performed on the second page during the program operation performed on the first page. That is, the first read voltage Vr1 is applied through the word line WL1 to read data stored in the memory cells MC11 to MC1m included in the second page of FIG. 7. The read data may be transmitted to the controller, and the number of error bits may be counted by the error correction block 230. Alternatively, the number of error bits may be determined by counting the number of memory cells belonging to the erase state with respect to the data of the second page, randomized to be programmed. The controller 200 of FIG. 1 may decode and input data such that the threshold voltages of memory cells of a selected page can be uniformly distributed. For example, when assuming that 4K bytes are coupled to the memory cells of the second page, and four threshold voltage distributions of the memory cells are created as a result that a program operation of the second page is completed, the controller 200 may decode and input data such that 1K-byte memory cells are included in the respective threshold voltage distributions S0, S1, S2, and S3. Accordingly, the threshold voltage distributions of the memory cells of the selected page can be uniformly created. Thus, the error bit check can be performed using the threshold voltage distributions. As illustrated in FIG. 8, when the threshold voltages of the memory cells are shown as four threshold voltage distributions S0, S1, S2, and S3, if data is read using the first read voltage Vr1, the threshold voltages of the memory cells are uniformly distributed such that programmed cells (e.g., cells read as '0') become 3K and unprogrammed cells (e.g., cells read as '1') becomes 1K. If the value obtained by counting the number of '1' among the data read using the first read voltage Vr1 is a value smaller than 3K, it may be determined that error bits corresponding to the value smaller than 3K have been generated. That is, the generation trend of error bits may be detected even when only least significant bit (LSB) data is read by applying only the first read voltage Vr1 as illustrated in FIG. 10. In another embodiment, data may be read by applying a plurality of read voltages, and the number of memory cells in which error bits are generated may be detected based on the read data. For example, the number of memory cells in which error bits are generated may be detected by applying all of the first to third read voltages Vr1, Vr2, and Vr3 shown in FIG. 8. When the number of error bits checked on the second page is larger than that of correctable bits, an ECC fail occurs in data of the corresponding page, and the data cannot be recovered. In the present disclosure, when the number of error bits checked on the second page exceeds a certain level, it is determined that the probability that the ECC fail will occur is high, and thus a backup operation is performed on data of the second page.

For example, it is defined that the number of error bits checked on the second page is $N_\varepsilon$, the maximum number of bits correctable through an ECC operation is $N_C$, and an error critical value for performing a backup operation on data is $N_T$. Here, $N_T$ is an integer smaller than $N_\varepsilon$ ($N_T<N_C$). In this case, when the following Relational Expression is satisfied, the backup operation on the data of the second page is performed.

$$N^T<N_\varepsilon<N_C \quad \text{Relational Expression 1}$$

When the above-described Relational Expression 1 is satisfied as a result of applying the first read voltage Vr1, the recovery of data is still possible through the ECC operation, but it is highly likely that the number of error bits will exceed NC due to influence caused by program disturbance, etc. Thus, the backup operation is performed, in advance, on the data of the page when the above-described Relational Expression 1 is satisfied, so that the probability that ECC errors will occur can be anticipatively reduced.

Meanwhile, when the following Relational Expression 2 is satisfied, the backup operation is not performed on the data of the second page.

$$N_\varepsilon<N_T<N_C \quad \text{Relational Expression 2}$$

That is, the above-described Relational Expression 2 means a situation in which a small quantity of errors is still generated on the data of the second page, and means that the range of fluctuation of threshold voltages is not severe. Thus, in a state in which the above-described Relational Expression 2 is satisfied, the program operation of the memory cells MC11' to MC1m' belonging to the first page is resumed, and a sixteenth program pulse Vpgmt+1 is applied to the memory cells MC11' to MC1m' through the word line WL1. Subsequently, an error bit check is again performed on the adjacent second page.

When the number of error bits, which satisfies the above-described Relational Expression 1, is detected while the application of the program pulse on the first page and the error bit check on the second page are being repeated, the data of the second page may be moved to another position.

Referring to FIG. 10, it is illustrated that an eighteenth program pulse Vpgmt+3 is applied in the above-described manner, and the program operation is completed. In the above-described example, the second critical value is 20. Hence, when the program operation is not completed even though a twentieth program pulse is applied, this may be finally treated as a program fail. Meanwhile, in FIG. 10, it is illustrated that only the first read voltage Vr1 is applied in the error bit check performed on the second page. This is because the probability that error bits will be generated is highest as the range of fluctuation of threshold voltages of memory cells in the erase state S0 among the memory cells MC11 to MC1m belonging to the second page is largest when the program pulse is repetitively applied to the first page. However, in some embodiments, the error bit check may be performed using the second read voltage Vr2, the third read voltage Vr3, or a combination thereof. For example, when the error bit check is performed on the second page, the error bit check may be performed by applying the second read voltage Vr2 and the third read voltage Vr3 as well as the first read voltage Vr1.

Meanwhile, according to the embodiment illustrated in FIG. 10, when the number of times of applying the program pulse to the first page exceeds the first critical value, the error bit check is performed as the first read voltage Vr1 is applied to the memory cells MC11 to MC1m belonging to the adjacent second page whenever the program pulse is applied to the memory cells MC11' to MC1m' belonging to the first page. However, the embodiment illustrated in FIG. 10 is illustrative, and the number of times of performing the error bit check and the time when the error bit check is performed may be variously changed. For example, in an embodiment, when the number of times of applying the program pulse to the first page exceeds the first critical value, the error bit check may be performed only once. In FIG. 10, when the eighteenth program pulse Vpgm+3 is applied, and the program operation is completed, the error bit check may be performed as the first read voltage Vr1 is applied to the memory cells belonging to the second page only when the program operation on the first page is completed. In another embodiment, when the eighteenth program pulse Vpgm+3 is applied, and the program operation is completed, the error bit check on the second page may be performed once whenever the program pulse is applied twice to the first page.

Figure 11:
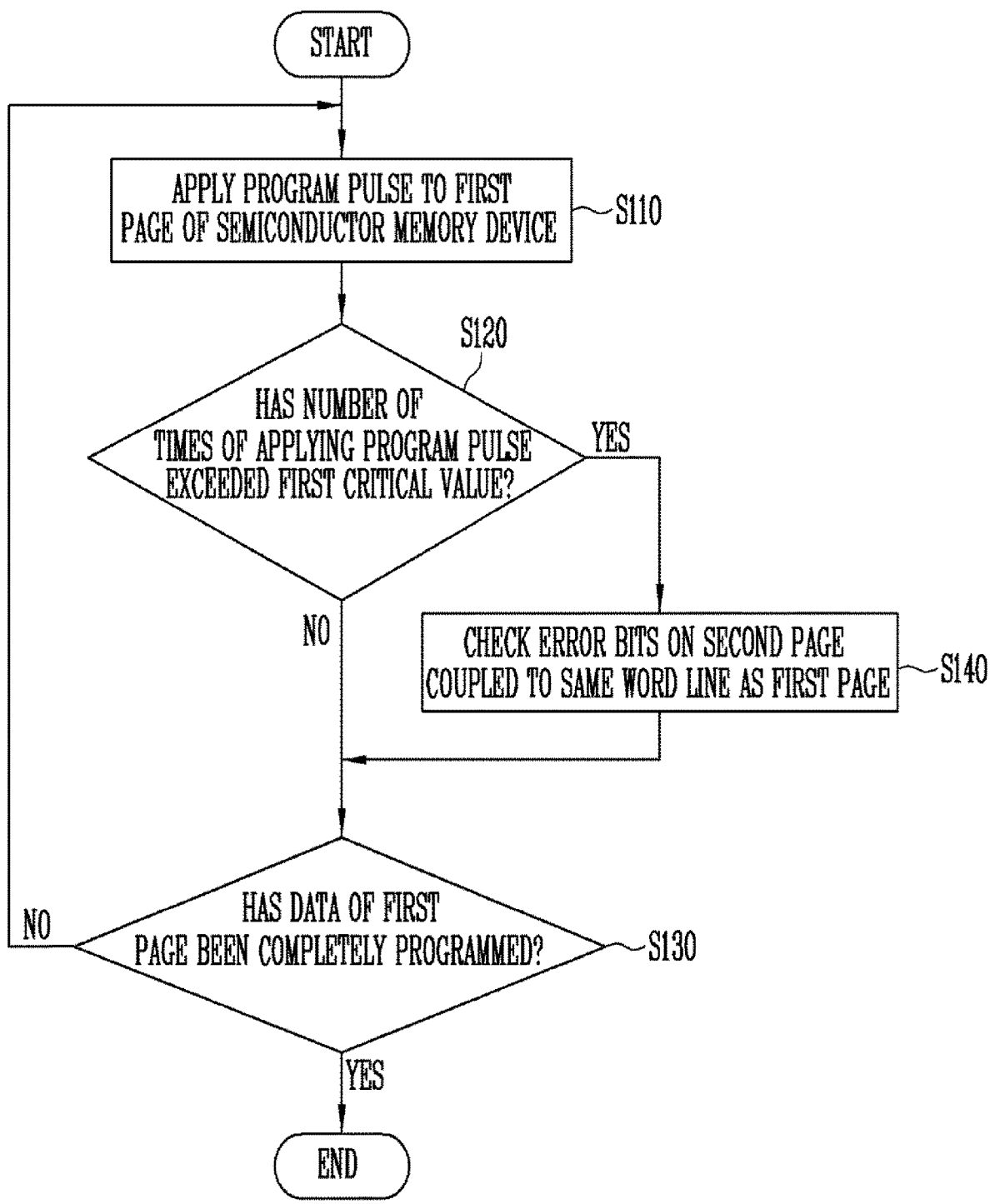
FIG. 11 is a flowchart illustrating a method for operating the semiconductor memory device according to an embodiment of the present disclosure.

FIG. 11 is a flowchart illustrating a method for operating the semiconductor memory device according to an embodiment of the present disclosure.

Referring to FIG. 11, a program pulse is applied to a first page of the semiconductor memory device (S110). That is, the controller 200 may transmit a program command and a program address to the semiconductor memory device 100, and the semiconductor memory device 100 may perform the step S110, corresponding to the program command and the program address. After the program pulse is applied, the semiconductor memory device 100 determines whether the number of times of applying the program pulse has exceeded a first critical value (S120). The step S120 may be performed by the control logic 130 of the semiconductor memory device 100. That is, the pulse counter 131 may count the number of times of applying the program pulse to program the first page, and compare the counted result with the first critical value stored in the pulse application critical value storage unit 135. When the number of times of applying the program pulse does not exceed the first critical value, it is determined whether data of the first page has been completely programmed by proceeding to step S130. When the data of the first page is completely programmed, a program operation is ended. When the data of the first page is not completely programmed, the program pulse is again applied by proceeding to the step S110. That is, the steps S110, S120, and S130 may be performed by the semiconductor memory device 100 of the memory system 50.

When the number of times of applying the program pulse exceeds the first critical value as the determined result of the step S120, error bits are checked on a second page by proceeding to step S140. As described above with reference to FIG. 7, the second page is a page that has already been completely programmed, and means a page coupled to the same word line as the first page. As illustrated in FIG. 10, in the step S140, error bits are checked on the second page by applying a read voltage Vr1. The step S140 may be performed by the semiconductor memory device 100 and the controller 200 of the memory system 50. An embodiment of the step S140 will be described later with reference to FIG. 12.

Figure 12:
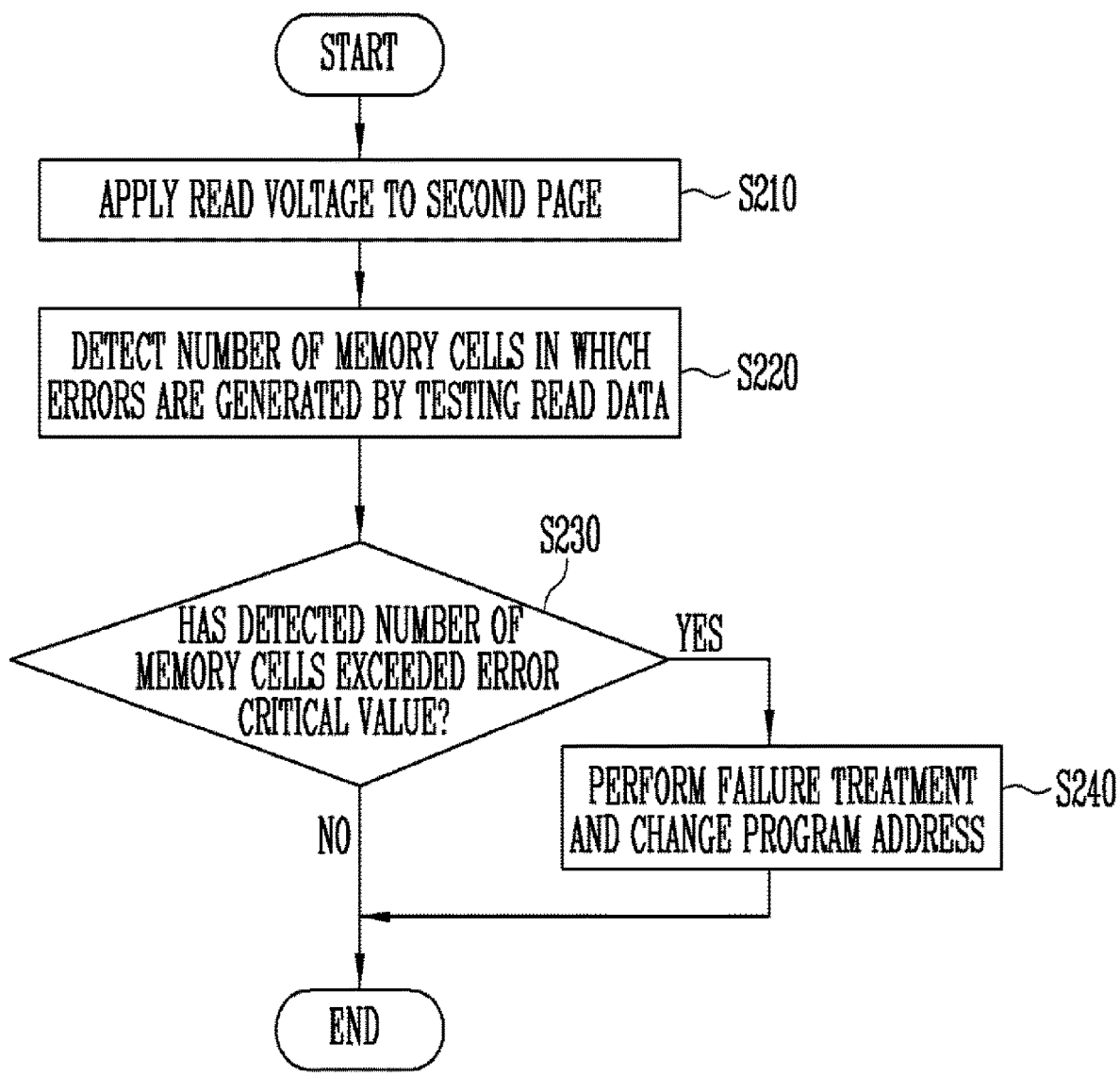
FIG. 12 is a flowchart illustrating a step of checking error bits in FIG. 11.

FIG. 12 is a flowchart illustrating the step of checking error bits in FIG. 11.

Referring to FIG. 12, in order to check error bits on the second page, a read voltage is applied to the second page (S210), the number of memory cells in which errors are generated is detected by testing read data (S220), and it is determined whether the detected number of memory cells has exceeded a predetermined error critical value (S230).

When the detected number of memory cells exceeds the predetermined error critical value, failure treatment is performed on the second page, and the program address is changed (S240).

In the step S210, the read voltage is applied to the second page of the semiconductor memory device 100. To this end, first, the controller 200 may transmit commands for applying the read voltage to the semiconductor memory device 100. Then, the semiconductor memory device 100 may apply the read voltage Vr1 illustrated in FIG. 10 to the memory cells MC11 to MC1m belonging to the second page in response to the commands. Meanwhile, read data is transmitted from the semiconductor memory device 100 to the controller 200.

In the step S220, the number $N_\varepsilon$ of memory cells in which errors are generated is detected by testing the read data transmitted to the controller 200. As described above, the number of memory cells in which errors are generated may be detected through the ECC operation.

In the step S230, it is determined whether the detected number $N_\varepsilon$ of memory cells has exceeded the predetermined error critical value $N_T$. When the detected number $N_\varepsilon$ of memory cells exceeds the predetermined error critical value $N_T$ as illustrated in the above-described Relational Expression 1, the failure treatment is performed on the corresponding second page, and the program address is changed (S240). An embodiment of the step S240 will be described later with reference to FIG. 13.

Figure 13:
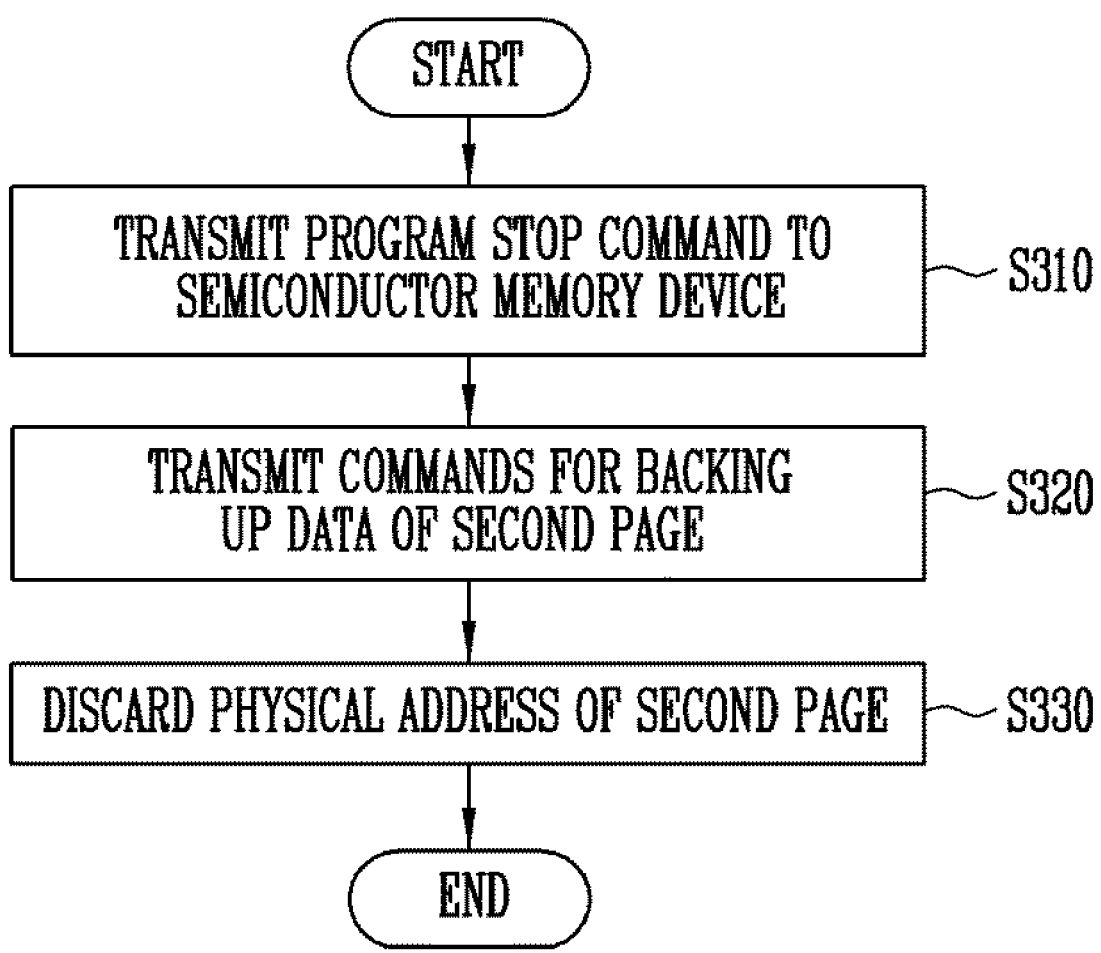
FIG. 13 is a flowchart illustrating an embodiment of a step of performing failure treatment and changing a program address in FIG. 12.

FIG. 13 is a flowchart illustrating an embodiment of the step of performing the failure treatment and changing the program address in FIG. 12.

Referring to FIG. 13, a program stop command may be transmitted to the semiconductor memory device 100 by the controller 200 (S310). The semiconductor memory device 100 may stop the program operation performed on the data of the first page in response to the program stop command.

In step S320, commands for backing up the data of the second page are transmitted to the semiconductor memory device 100 by the controller 200. The semiconductor memory device 100 may back up the data of the second page to another physical position in response to the commands. In an embodiment, the controller 200 may transmit, to the semiconductor memory device 100, commands for backing up, to another physical position, only data of the second page, in which the number $N_\varepsilon$ of memory cells in which errors are generated exceeds the predetermined error critical value $N_T$. In an embodiment, the controller 200 may transmit, to the semiconductor memory device 100, commands for backing up, to another physical position, the entire data of the memory block BLK1 including the second page.

In step S330, the physical address of the second page of which data backup is completed by the controller 200 is discarded. The controller 200 may perform the step S330 by updating the relationship between a logical address and a physical address, which are included in a map table. When only the data of the second page is backed up to another physical position in the step S320, the controller 200 may update a physical address corresponding to the logical address of the second page to a physical position at which the data of the second page is backed up in the step S330. When the entire data of the memory block including the second page is backed up to another memory block in the step S320, the controller 200 a physical address corresponding to a logical address corresponding to the backed-up data to a physical position corresponding to the new memory block in the step S330.

Figure 14:
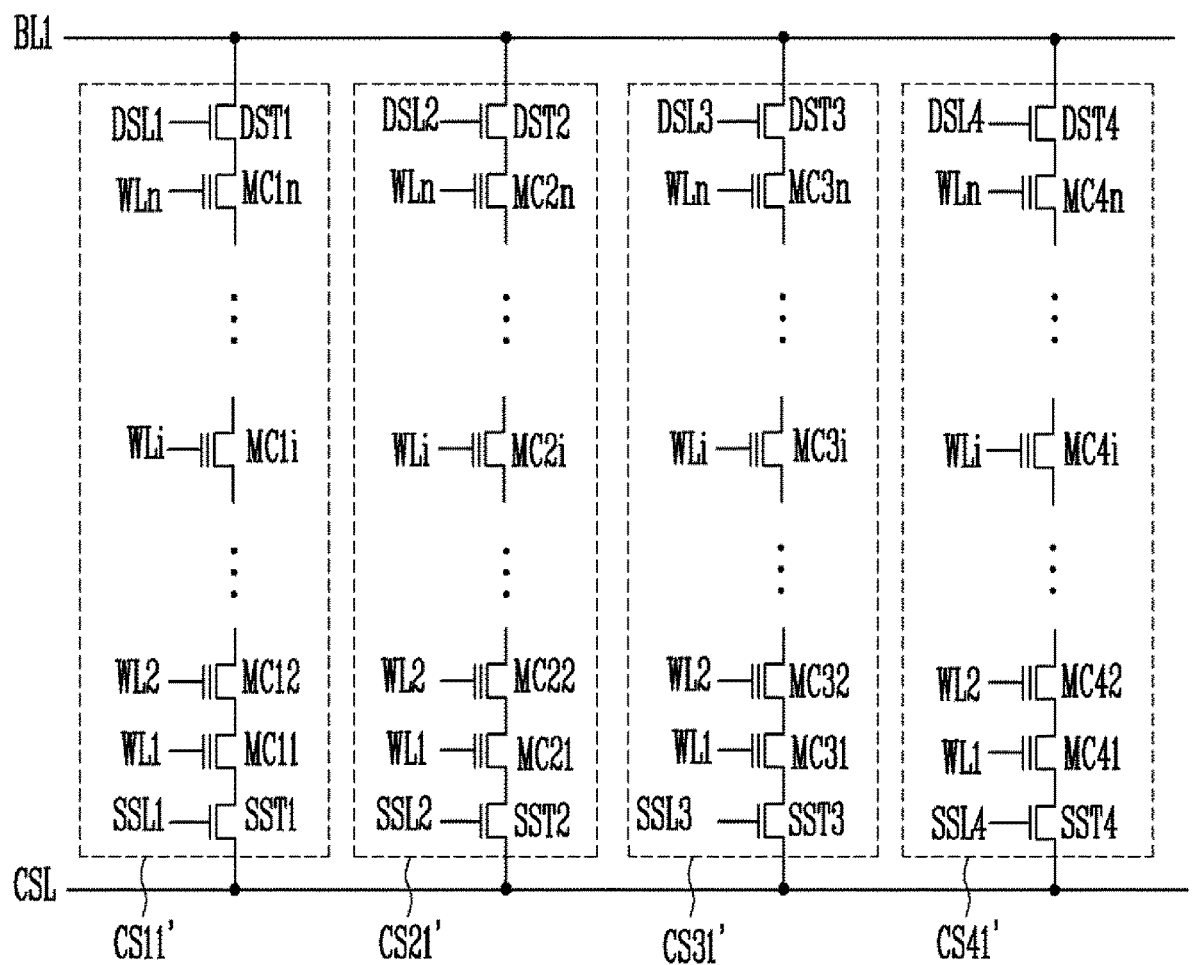
FIG. 14 is a circuit diagram illustrating an example of an embodiment of the memory cell array.

FIG. 14 is a circuit diagram illustrating an example of an embodiment of the memory cell array.

Referring to FIG. 14, there is illustrated a portion of the memory cell array in which four cell strings arranged in the column direction (i.e., the +Y direction) are included in each memory block. That is, in FIG. 14, the memory block of the memory cell array includes a first string group, a second string group, a third string group, and a fourth string group. The first string group may include a cell string CS11' and another plurality of cell strings. The second string group may include a cell string CS21' and another plurality of cell strings. The third string group may include a cell string CS31' and another plurality of cell strings. The fourth string group may include a cell string CS41' and another plurality of cell strings. That is, only the cell strings CS11', CS21', CS31', and CS41' among the cell strings belonging to the first to fourth string groups are illustrated in FIG. 14. However, like the memory cell array illustrated in FIG. 4 or 5, cell strings belonging to the first to fourth string groups exist in the +X direction.

Figure 15:
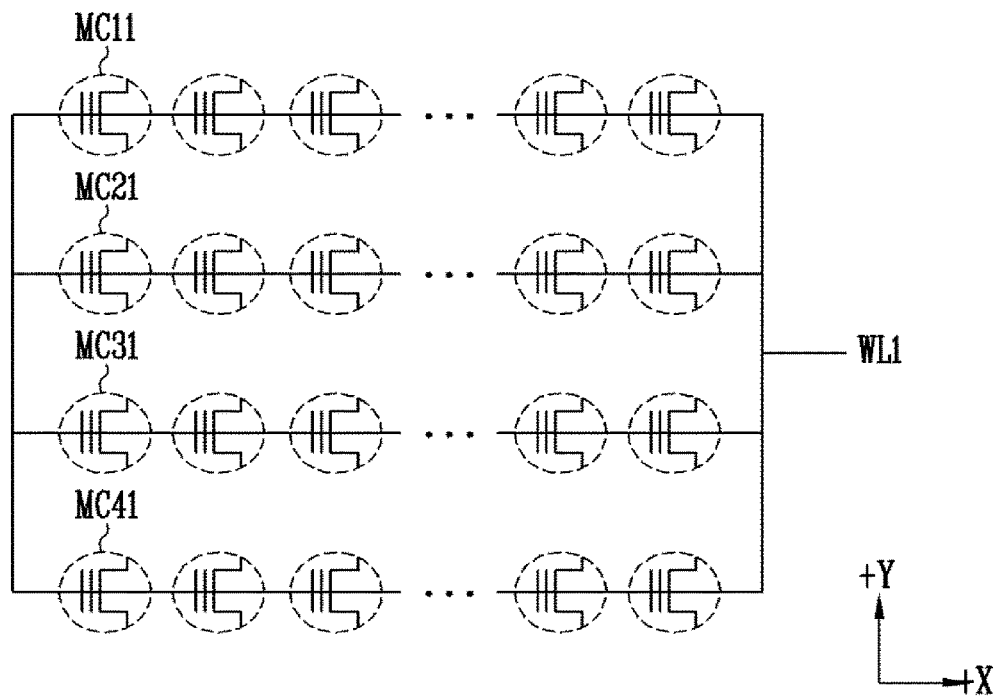
FIG. 15 is a diagram illustrating a relationship between pages and cell strings of FIG. 14.

FIG. 15 is a diagram illustrating a relationship between pages and cell strings of FIG. 14.

Referring to FIG. 15, in the structure of the memory cell array of FIG. 14, a page viewed in the +Z direction is illustrated. Referring together to FIGS. 14 and 15, pages coupled to the first word line WL1 are illustrated. As illustrated in FIG. 15, four pages are coupled to the same first word line WL1.

In a program operation of the memory cell array, a first page including a memory cell CM11 may be first programmed, and a second page including a memory cell MC21 may be then programmed. Then, a third page including a memory cell MC31 may be programmed, and a fourth page including a memory cell MC41 may be finally programmed.

When the second page including the memory cell MC21 is programmed, an error bit check on the first page may be performed. When the third page including the memory cell MC31 is programmed, an error bit check on the first page or the second page may be performed. When the fourth page including the memory cell MC41 is programmed, an error bit check on the first page, the second page, or the third page may be performed.

Meanwhile, when the fourth page is programmed, an error bit check may be performed on all of the first to third pages. However, the program pulse may have greatest influence on the first page. Therefore, in an example of an embodiment, when the fourth page is programmed, an error bit check may be performed on only the first page.

According to the present disclosure, the first critical value may be a fixed value that is experimentally determined. For example, when it is experimentally recognized that a plurality of read fails occurs in an adjacent page until when the program pulse is applied about 15 times, the first critical value may be determined as 15. In another embodiment, in a program operation of an adjacent page, the first critical value may be determined as the total number of times of applying the program pulse that is applied until the program operation is completed. For example, in FIG. 15, if a program operation of the first page is completed by applying the program pulse a total of 13 times in the program operation of the first page, the first critical value used in a program operation of the second page may be determined as 13. Meanwhile, when the program operation of the second page is completed, the number of program pulses applied may be updated as the first critical value to be used in a program operation of the third page. In this case, the updated first critical value may be stored in the pulse application critical value storage unit 135 of FIG. 9.

In the embodiment of FIGS. 14 and 15, drain select transistors DST1, DST2, DST3, and DST4 of the cell string CS11' belonging to the first string group, the cell string CS21' belonging to the second string group, the cell string CS31' belonging to the third string group, and the cell string CS41' belonging to the fourth string group are coupled to the same bit line BL1. However, this is merely an embodiment of the present disclosure. In some embodiments, the cell strings belonging to the first to fourth string groups may be coupled to different bit lines, respectively. In this case, the different bit lines respectively coupled to the cell strings belonging to the first to fourth string groups can be driven independently from each other, and the bit lines can be individually controlled.

Referring to FIGS. 3 to 7, 14, and 15, there is illustrated an embodiment in which the plurality of memory blocks BLK1 to BLKz in the memory cell array 110 have a three-dimensional structure. However, this is illustrative, and the present disclosure may be applied to memory blocks having a two-dimensional structure.

Figure 16:
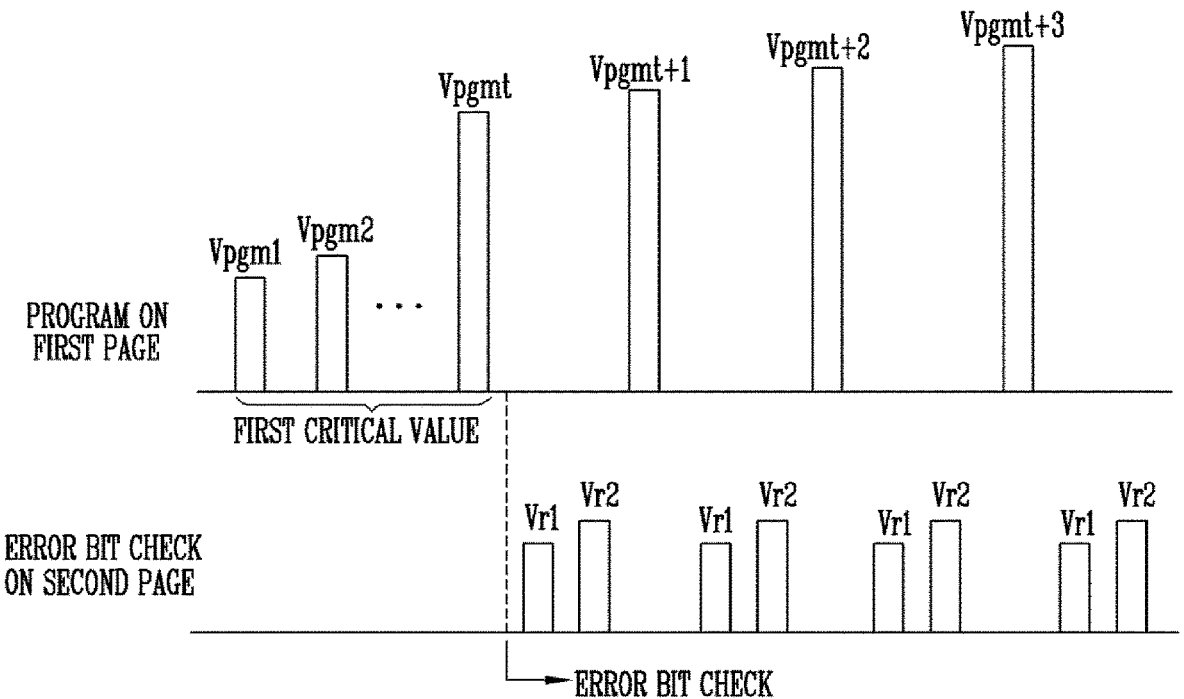
FIG. 16 is a diagram illustrating a program process of the semiconductor memory device according to an embodiment of the present disclosure.

FIG. 16 is a diagram illustrating a program process of the semiconductor memory device according to an embodiment of the present disclosure. In FIG. 16, contents overlapping with those of FIG. 10 will be omitted.

Referring to FIG. 16, unlike FIG. 10, the first read voltage Vr1 and the second read voltage Vr2 are applied when an error bit check is performed on an adjacent page. Accordingly, an error bit check may be performed according to a variation in threshold voltage of memory cells corresponding to not only the erase state S0 but also the first program state S1. In some embodiments, all of the first read voltage Vr1, the second read voltage Vr2, and the third read voltage Vr3 may be applied when an error bit check is performed on an adjacent page. In this case, a read fail probability may be checked according to a variation in threshold voltage of memory cells corresponding to the erase state S0, the first program state S1, and the second program state S2.

Figure 17:
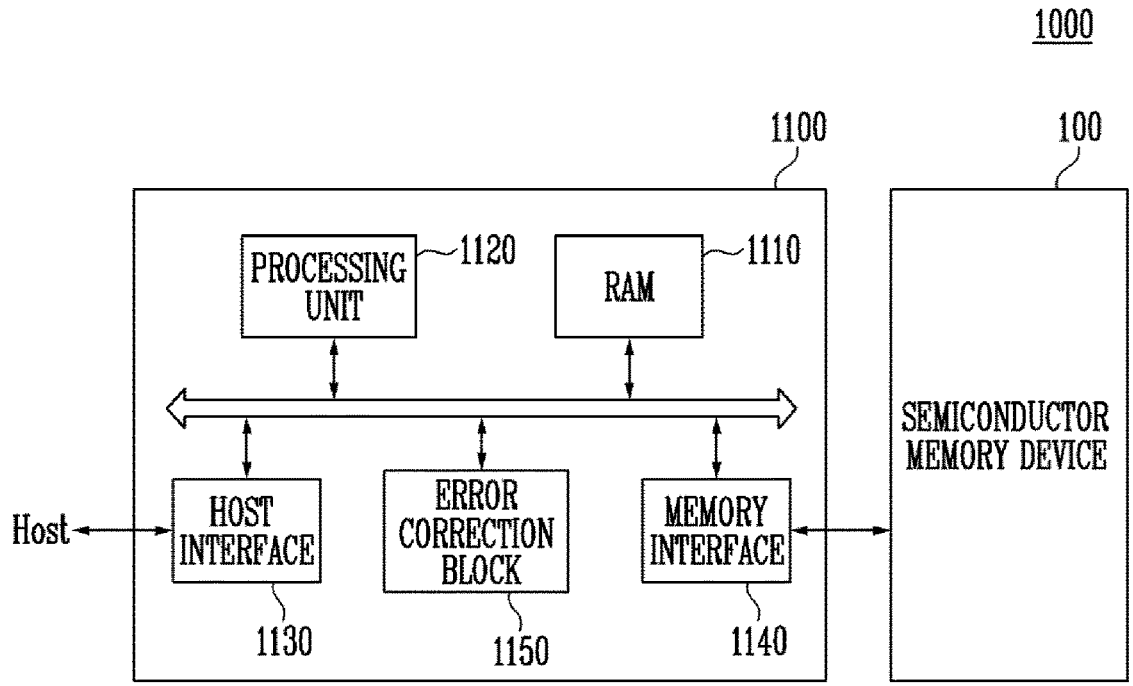
FIG. 17 is a block diagram illustrating a memory system including the semiconductor memory device of FIG. 2.

FIG. 17 is a block diagram illustrating a memory system including the semiconductor memory device of FIG. 2.

Referring to FIG. 17, the memory system 1000 includes a semiconductor memory device 100 and the controller 1100. The semiconductor memory device 100 may be the semiconductor memory device described with reference to FIG. 2. Hereinafter, overlapping descriptions will be omitted.

The controller 1100 is coupled to a host Host and the semiconductor memory device 100. The controller 1100 is configured to access the semiconductor memory device 100 in response to a request from the host Host. For example, the controller 1100 is configured to control read, write, erase, and background operations of the semiconductor memory device 100. The controller 1100 is configured to provide an interface between the semiconductor memory device 100 and the host Host. The controller 1100 is configured to drive firmware for controlling the semiconductor memory device 100.

The controller 1100 includes a random access memory (RAM) 1110, a processing unit 1120, a host interface 1130, a memory interface 1140, and an error correction block 1150. The RAM 1110 is used as at least one of an operation memory of the processing unit 1120, a cache memory between the semiconductor memory device 100 and the host Host, and a buffer memory between the semiconductor memory device 100 and the host Host. The processing unit 1120 controls overall operations of the controller 1100. Also, the controller 1100 may arbitrarily store program data provided from the host Host in a write operation.

The host interface 1130 includes a protocol for exchanging data between the host Host and the controller 1100. In an example of an embodiment, the controller 1100 is configured to communicate with the host Host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, and a private protocol.

The memory interface 1140 interfaces with the semiconductor memory device 100. For example, the memory interface 1140 may include a NAND interface or a NOR interface.

The error correction block 1150 is configured to detect and correct an error of data received from the semiconductor memory device 100 by using an error correction code (ECC). The processing unit 1120 may control the semiconductor memory device 100 to adjust a read voltage, based on an error detection result of the error correction block 1150, and to perform re-reading. In an example of an embodiment, the error correction block 1150 may be provided as a component of the controller 1100.

The controller 1100 and the semiconductor memory device 100 may be integrated into one semiconductor device. In an example of an embodiment, the controller 1100 and the semiconductor memory device 100 may be integrated into one semiconductor device, to constitute a memory card. For example, the controller 1100 and the semiconductor memory device 100 may be integrated into one semiconductor device, to constitute a memory card such as a PC card (personal computer memory card international association (PCMCIA)), a compact flash (CF) card, a smart media card (SM or SMC), a memory stick, a multimedia card (MMC, RS-MMC or MMCmicro), an SD card (SD, miniSD, microSD or SDHC), or a universal flash storage (UFS).

The controller 1100 and the semiconductor memory device 100 may be integrated into one semiconductor device to constitute a semiconductor drive (solid state drive (SSD)). The semiconductor drive SSD includes a storage device configured to store data in a semiconductor memory. If the memory system 1000 is used as the semiconductor drive SSD, the operating speed of the host Host coupled to the memory system 1000 can be remarkably improved.

In an example, the memory system 1000 may be provided as one of various components of an electronic device such as a computer, a ultra mobile PC (UMPC), a workstation, a net-book, a personal digital assistant (PDA), a portable computer, a web tablet, a wireless phone, a mobile phone, a smart phone, an e-book, a portable multimedia player (PMP), a portable game console, a navigation system, a black box, a digital camera, a 3-dimensional television, a digital audio recorder, a digital audio player, a digital picture recorder, a digital picture player, a digital video recorder, a digital video player, a device capable of transmitting/receiving information in a wireless environment, one of various electronic devices that constitute a home network, one of various electronic devices that constitute a computer network, one of various electronic devices that constitute a telematics network, an RFID device, or one of various components that constitute a computing system.

In an example of an embodiment, the semiconductor memory device 100 or the memory system 1000 may be packaged in various forms. For example, the semiconductor memory device 100 or the memory system 1000 may be packaged in a manner such as package on package (PoP), ball grid arrays (BGAs), chip scale packages (CSPs), plastic leaded chip carrier (PLCC), plastic dual in-line package (PDIP), die in Waffle pack, die in wafer form, chip on board (COB), ceramic dual in-line package (CERDIP), plastic metric quad flat pack (MQFP), thin quad flat pack (TQFP), small outline integrated circuit (SOIC), shrink small out line package (SSOP), thin small outline package (TSOP), thin quad flat pack (TQFP), system in package (SIP), multi chip package (MCP), wafer-level fabricated package (WFP), or wafer-level processed stack package (WSP).

Figure 18:
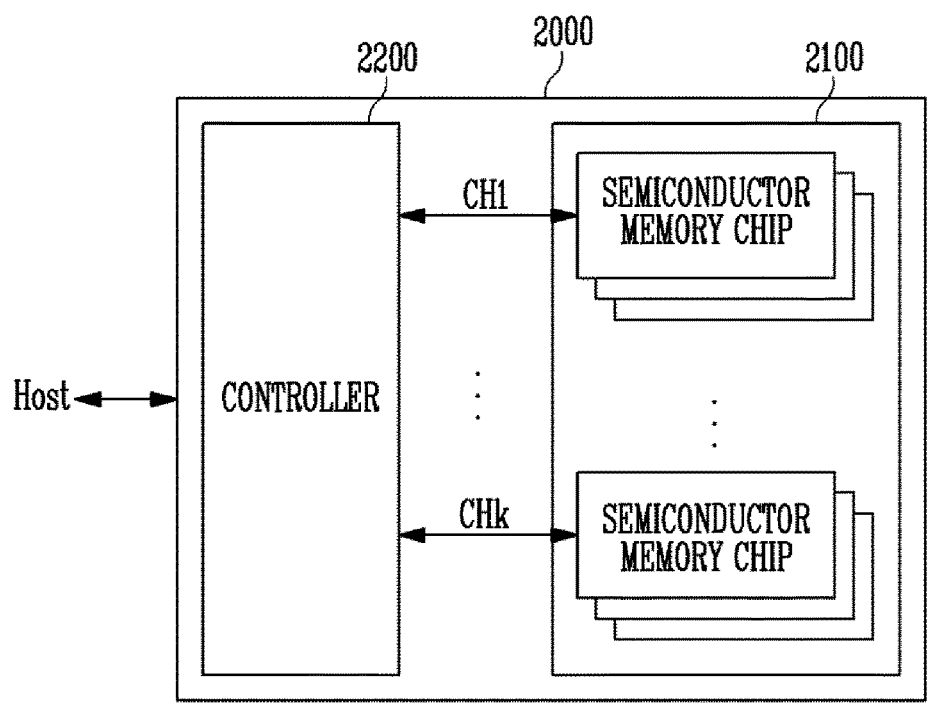
FIG. 18 is a block diagram illustrating an application example of the memory system of FIG. 17.

FIG. 18 is a block diagram illustrating an application example of the memory system of FIG. 17.

Figure 19:
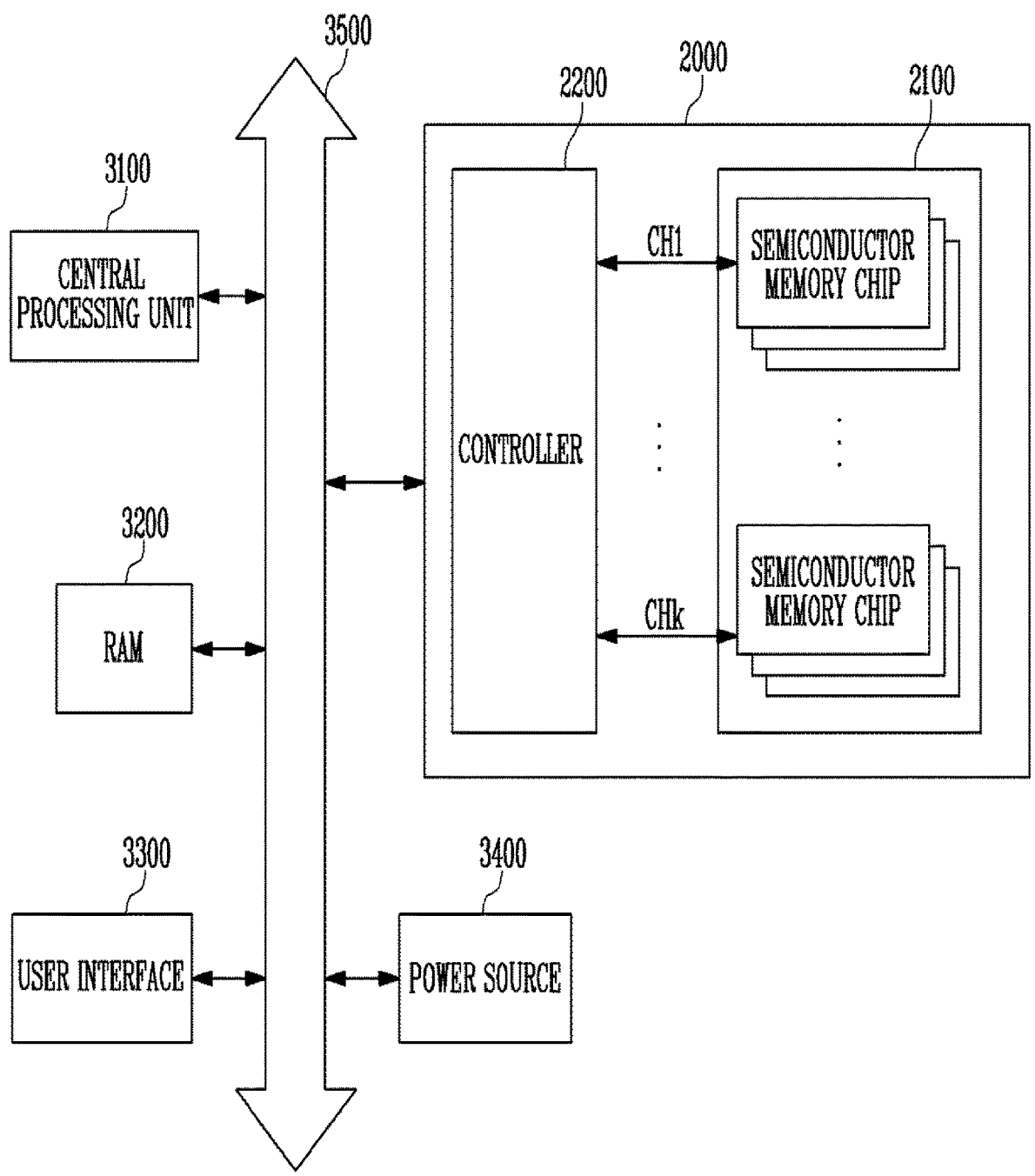
FIG. 19 is a block diagram illustrating a computing system including the memory system described with reference to FIG. 18.

Referring to FIGS. 19 and 18, the memory system 2000 includes a semiconductor memory device 2100 and a controller 2200. The semiconductor memory device 2100 includes a plurality of semiconductor memory chips. The plurality of semiconductor memory chips are divided into a plurality of groups.

In FIG. 18, it is illustrated that the plurality of groups communicate with the controller 2200 through first to kth channels CH1 to CHk. Each semiconductor memory chip may be configured and operated identically to the semiconductor memory device 100 described with reference to FIG. 2.

Each group is configured to communicate with the controller 2200 through one common channel. The controller 2200 is configured similarly to the controller 1100 described with reference to FIG. 17. The controller 2200 is configured to control the plurality of memory chips of the semiconductor memory device 2100 through the plurality of channels CH1 to CHk.

FIG. 19 is a block diagram illustrating a computing system including the memory system described with reference to FIG. 18.

Referring to FIG. 19, the computing system 3000 includes a central processing unit 3100, a RAM 3200, a user interface 3300, a power source 3400, a system bus 3500, and a memory system 2000.

The memory system 2000 is electrically coupled to the central processing unit 3100, the RAM 3200, the user interface 3300, and the power source 3400 through the system bus 3500. Data supplied through user interface 3300 or data processed by the central processing unit 3100 are stored in the memory system 2000.

In FIG. 19, it is illustrated that the semiconductor memory device 2100 is coupled to the system bus 3500 through the controller 2200. However, the semiconductor memory device 2100 may be directly coupled to the system bus 3500. In this case, the function of the controller 2200 may be performed by the central processing unit 3100 and the RAM 3200.

In FIG. 19, it is illustrated that the memory system 2000 described with reference to FIG. 18 is provided. However, the memory system 2000 may be replaced by the memory system 1000 described with reference to FIG. 17. In an example of an embodiment, the computing system 3000 may be configured to include both the memory systems 1000 and 2000 described with reference to FIGS. 17 and 18.

According to the present disclosure, it may be possible to provide a semiconductor memory device and a controller, of which reliability is improved.

Examples of embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A method for operating a semiconductor memory device, the method comprising:
applying, with a peripheral circuit during a single program operation for programming data of a first page, a program pulse to a word line coupled to the first page and a second page included in the semiconductor memory device;
determining, with a control logic, whether the number of times of applying the program pulse, during the single program operation for programming the data of the first page, has exceeded a first critical value; and
performing, with a controller, an error bit check on the second page, in response to the determined result of whether the first critical value has been exceeded.

2. The method of claim 1, further comprising, when the number of times of applying the program pulse does not exceed the first critical value, determining, with the control logic, whether the data of the first page has been completely programmed.

3. The method of claim 2, wherein, when the data of the first page is not completely programmed, the program pulse for programming the data of the first page is repetitively applied.

4. The method of claim 1, wherein the performing of the error bit check on the second page includes:
applying a read voltage to the second page;
detecting the number of memory cells in which errors are generated by testing read data;
determining whether the detected number of memory cells has exceeded a predetermined error critical value; and
performing failure treatment on the second page and changing a program address, in response to the determined result of whether the detected number of memory cells has exceeded the predetermined error critical value.

5. The method of claim 4, wherein the performing of the failure treatment and the changing of the program address include: when the detected number of memory cells exceeds the error critical value,
transmitting a program stop command to the semiconductor memory device;
transmitting commands for backing up data of the second page to the semiconductor memory device; and
discarding a physical address of the second page.

6. The method of claim 5, wherein, in the transmitting of the commands for backing up the data of the second page to the semiconductor memory device, data stored in memory cells coupled to the second page is backed up to another page, and wherein, in the discarding of the physical address of the second page, a physical address of the word line coupled to the second page is discarded.

7. The method of claim 5, wherein, in the transmitting of the commands for backing up the data of the second page to the semiconductor memory device, data stored in a memory block including the second page is backed up to another memory block, and wherein, in the discarding of the physical address of the second page, a physical address of the memory block including the second page is discarded.

8. The method of claim 4, wherein, in the applying of the read voltage to the second page, one read voltage is applied to memory cells belonging to the second page, and wherein, in the detecting of the number of memory cells in which errors are generated by testing the read data, the number of memory cells in which errors are generated among memory cells in an erase state is detected by the one read voltage.

9. The method of claim 8, wherein, in the detecting of the number of memory cells in which errors are generated by testing the read data, the number of the memory cells in which the errors are generated is detected in response to randomized data.

10. The method of claim 4, wherein, in the applying of the read voltage to the second page, a plurality of read voltages are applied to memory cells belonging to the second page.

11. The method of claim 10, wherein, in the detecting of the number of memory cells in which errors are generated by testing the read data, the number of memory cells in which errors are generated is detected through an error-correcting code (ECC) operation.

12. The method of claim 4, wherein the error critical value is determined in response to the number of times of applying a program pulse applied in a program operation of the second page.

13. The method of claim 12, wherein, when the program operation of the first page is completed, the error critical value is updated as the number of times of applying the program pulse applied in the program operation of the first page.

14. A memory system comprising:
a semiconductor memory device including a first page coupled to a first word line and a second page coupled to the first word line; and a controller configured to control a program operation for programming data of the first page, wherein the controller controls the semiconductor memory device to perform an error bit check on the second page in response to the number of times a program pulse is applied to the first word line during a single program operation of the first page.

15. The memory system of claim 14, wherein when the number of times of applying the program pulse for programming the first page exceeds a first critical value during the program operation of the first page, the controller controls the semiconductor memory device to perform the error bit check on the second page.

16. The memory system of claim 15, wherein the semiconductor memory device further includes a state register, wherein the controller transmits a program command for programming the first page to the semiconductor memory device, and wherein the semiconductor memory device applies the program pulse to the first page in response to the program command, and updates the state register when the number of times of applying the program pulse exceeds the first critical value.

17. The memory system of claim 16, wherein the controller transmits commands for performing the error bit check on the second page to the semiconductor memory device, in response to the update of the state register.

18. The memory system of claim 17, wherein the semiconductor memory device reads data of the second page and transmits the read data to the controller, in response to the commands for performing the error bit check.

19. The memory system of claim 18, wherein the controller detects the number of memory cells in which errors are generated by analyzing the read data of the second page, and wherein, when the detected number of memory cells exceeds a predetermined error critical value, the controller transmits commands for backing up the data of the second page to the semiconductor memory device.

20. The memory system of claim 19, wherein the controller discards a physical address of the second page while transmitting the commands for backing up the data of the second page to the semiconductor memory device.

* * * * *